(12) United States Patent
Imanaka

(10) Patent No.: US 11,927,636 B2
(45) Date of Patent: Mar. 12, 2024

(54) DIAGNOSTIC DEVICE, ENERGY STORAGE APPARATUS, AND DIAGNOSTIC METHOD

(71) Applicant: GS Yuasa International Ltd., Kyoto (JP)

(72) Inventor: Yuki Imanaka, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 436 days.

(21) Appl. No.: 16/980,096

(22) PCT Filed: Mar. 27, 2019

(86) PCT No.: PCT/JP2019/013269
§ 371 (c)(1),
(2) Date: Sep. 11, 2020

(87) PCT Pub. No.: WO2019/189405
PCT Pub. Date: Oct. 3, 2019

(65) Prior Publication Data
US 2021/0270900 A1    Sep. 2, 2021

(30) Foreign Application Priority Data

Mar. 27, 2018    (JP) .................................. 2018-059803

(51) Int. Cl.
*G01R 31/00*    (2006.01)
*G01R 31/327*    (2006.01)
(Continued)

(52) U.S. Cl.
CPC ......... *G01R 31/3277* (2013.01); *G01R 31/52* (2020.01); *H01G 2/16* (2013.01);
(Continued)

(58) Field of Classification Search
CPC ..... G01R 31/3277; G01R 31/52; G01R 31/00
(Continued)

(56) References Cited

U.S. PATENT DOCUMENTS 5,534,364 A    7/1996   Watanabe et al.
6,020,811 A  * 2/2000   Saito .................. B60G 17/0195
                                                       340/517
(Continued)

FOREIGN PATENT DOCUMENTS

EP    3 282 533 A1    2/2018
JP    S56-126774 A   10/1981
(Continued)

OTHER PUBLICATIONS

International Search Report (ISR) (PCT Form PCT/ISA/210), in PCT/JP2019/013269, dated May 7, 2019.

*Primary Examiner* — Vincent Q Nguyen
(74) *Attorney, Agent, or Firm* — MCGINN I.P. LAW GROUP, PLLC

(57) ABSTRACT

A diagnostic device and method diagnoses damage to a breaker that interrupts a current of an energy storage device. The damage to the breaker is diagnosed on the basis of a short-circuit current at a time of an external short circuit. The damage to the breaker can also be diagnosed on a basis of a short-circuit current during a first time from detection to interruption of a short circuit, and a short-circuit current during a second time from the interruption to convergence of the short-circuit current. An energy storage apparatus can include the diagnostic device.

5 Claims, 20 Drawing Sheets

(51) Int. Cl.
    *G01R 31/52*      (2020.01)
    *H01G 2/16*      (2006.01)
    *H01G 2/18*      (2006.01)
    *H01M 10/42*      (2006.01)
    *H01M 10/48*      (2006.01)
    *H01M 50/249*      (2021.01)
    *H01M 50/284*      (2021.01)
    *H01M 50/569*      (2021.01)
    *H01M 50/583*      (2021.01)

(52) U.S. Cl.
    CPC ............ *H01G 2/18* (2013.01); *H01M 10/425* (2013.01); *H01M 10/48* (2013.01); *H01M 50/249* (2021.01); *H01M 50/284* (2021.01); *H01M 50/569* (2021.01); *H01M 50/583* (2021.01); *H01M 2010/4271* (2013.01)

(58) Field of Classification Search
    USPC .................................................. 324/417–424
    See application file for complete search history.

(56) References Cited

U.S. PATENT DOCUMENTS

| | | | | |
|---|---|---|---|---|
| 6,081,189 A | * | 6/2000 | Warner | B60Q 11/007 |
| | | | | 324/504 |
| 10,732,223 B2 | * | 8/2020 | Donolo | G01R 31/3277 |
| 2002/0105768 A1 | | 8/2002 | Yamaguchi et al. | |
| 2003/0090271 A1 | * | 5/2003 | Hurwicz | G01R 31/3333 |
| | | | | 324/424 |
| 2009/0159413 A1 | * | 6/2009 | Perera | H01H 33/593 |
| | | | | 200/329 |
| 2012/0218676 A1 | * | 8/2012 | Demetriades | H01H 9/542 |
| | | | | 361/115 |
| 2016/0020042 A1 | * | 1/2016 | Stanton | H01H 1/5822 |
| | | | | 200/284 |
| 2016/0347194 A1 | * | 12/2016 | Kanayama | H02J 13/00004 |
| 2018/0062371 A1 | | 3/2018 | Imura | |
| 2019/0206645 A1 | * | 7/2019 | Sakai | H01H 33/04 |

FOREIGN PATENT DOCUMENTS

| | | |
|---|---|---|
| JP | S63-213229 A | 9/1988 |
| JP | S64-14832 A | 1/1989 |
| JP | H07-14564 A | 1/1995 |
| JP | 2001-045648 A | 2/2001 |
| JP | 2015-169483 A | 9/2015 |
| JP | 2016-158364 A | 9/2016 |
| JP | 2018-031778 A | 3/2018 |
| JP | 2018-038035 A | 3/2018 |
| KR | 20030067835 A | 8/2003 |

* cited by examiner (A)

| Short-circuit current Is | Damage |
|---|---|
| Is < A | Small |
| A ≦ Is ≦ B | Intermediate |
| Is > B | Large |

(A < B)

DIAGNOSTIC DEVICE, ENERGY STORAGE APPARATUS, AND DIAGNOSTIC METHOD

TECHNICAL FIELD

The present invention relates to a technology for diagnosing damage to a breaker.

BACKGROUND ART

A short-circuit current flows through a battery due to an external short circuit of an external terminal. Since the short-circuit current due to the external short circuit is larger than an allowable current of the battery, when the external short circuit is detected, the current is interrupted by using a breaker such as a relay (e.g., Patent Document 1).

PRIOR ART DOCUMENT

Patent Document

Patent Document 1: JP-A-2018-31778

SUMMARY OF THE INVENTION

Problems to be Solved by the Invention

The short-circuit current due to the external short circuit damages the breaker. Conventionally, occurrence of a failure of a breaker has been diagnosed (diagnose whether the breaker operates normally) afterwards. However, no consideration has been given to diagnosing damage to the breaker caused by an external short circuit.

An object of the present invention is to diagnose damage to a breaker caused by an external short circuit.

Means for Solving the Problems

In a diagnostic device for diagnosing damage to a breaker that interrupts a current of an energy storage device, the damage to the breaker is diagnosed on the basis of a short-circuit current at the time of an external short circuit. The time of an external short circuit includes a first time from detection to interruption of a short circuit and a second time from the interruption to convergence of the short circuit.

The present technology can be applied to an energy storage apparatus and a method of diagnosing damage to a breaker.

Advantages of the Invention

A diagnostic device can detect damage to a breaker caused by an external short circuit. Hence, based on the damage to the breaker, the diagnostic device can make a determination regarding safety such as whether or not the breaker can be used continuously without failure.

BRIEF DESCRIPTION OF THE DRAWINGS

FIG. 20 is a diagram showing the relationship between a short-circuit current and damage.

MODE FOR CARRYING OUT THE INVENTION

Figure 1:
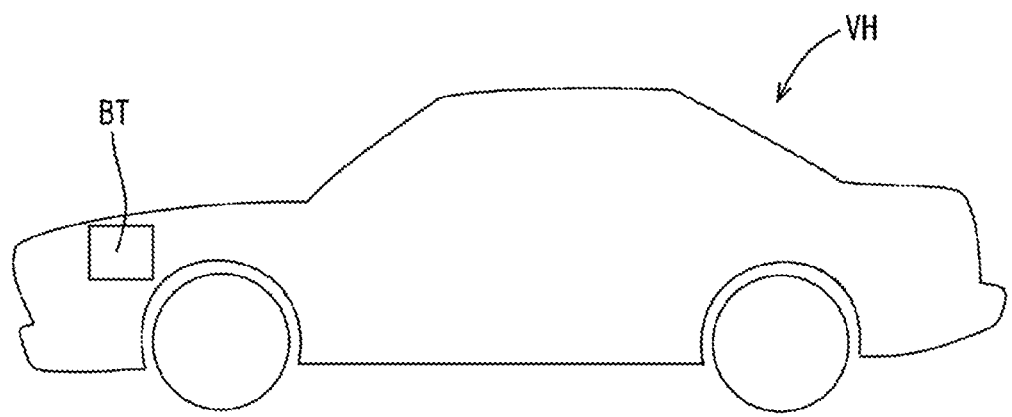
FIG. 1 is a side view of a vehicle.

A diagnostic device for diagnosing damage to a breaker that interrupts a current of an energy storage device diagnoses damage to the breaker on the basis of a short-circuit current at the time of an external short circuit. A diagnostic device can detect damage to a breaker caused by an external short circuit. Hence, based on the damage to the breaker, the diagnostic device can make a determination regarding safety such as whether or not the breaker can be used continuously without failure.

The diagnostic device preferably diagnoses damage to the breaker on the basis of at least two elements including a short-circuit current, from among a short-circuit current at the time of an external short circuit, the number of external short circuits, and a time during which a short-circuit current flowed through the breaker. The diagnostic device includes, as the damage diagnosis element, not only the short-circuit current but also the number of external short circuits and the time during which the short-circuit current flowed through the breaker. Hence, it is possible to diagnose the accumulation of damage.

The breaker is capable of interrupting a current and recovering from the interruption, and a downtime during which the breaker stops until recovery is preferably set from a short-circuit current at the time of an external short circuit and a time during which a short-circuit current flowed through the breaker. Failure of the breaker can be curbed by performing the recovery operation of the breaker after the elapse of the downtime. When the breaker is a relay, it is possible to keep contacts having generated heat due to the short-circuit current from sticking by the recovery operation.

The energy storage device may be a lithium ion secondary battery. A lithium ion secondary battery has a smaller internal resistance than a lead-acid battery, and a large current tends to flow at the time of an external short circuit. Hence, a breaker used in the lithium ion secondary battery is easily damaged and use of the damaged breaker is continued in some cases. By applying the present invention, it is possible to diagnose damage to the breaker, and the diagnostic device can perform treatment according to the damage.

A diagnostic device for diagnosing damage to a breaker that interrupts a current of an energy storage device diagnoses damage to the breaker on the basis of a short-circuit current during a first time from detection to interruption of a short circuit, and a short-circuit current during a second time from the interruption to convergence of the short circuit. Since the damage to the breaker is diagnosed on the basis of the short-circuit current during the first time and the short-circuit current during the second time, the damage to the breaker can be determined with higher accuracy than when the damage is determined only by the short-circuit current of any one of the periods.

The damage to the breaker may be diagnosed on the basis of a heat generation amount of the breaker during the first time and a heat generation amount of the breaker during the second time. It is possible to diagnose damage due to heat generation of the breaker.

Embodiment 1

1. Structure Description of Battery BT1

Figure 2:
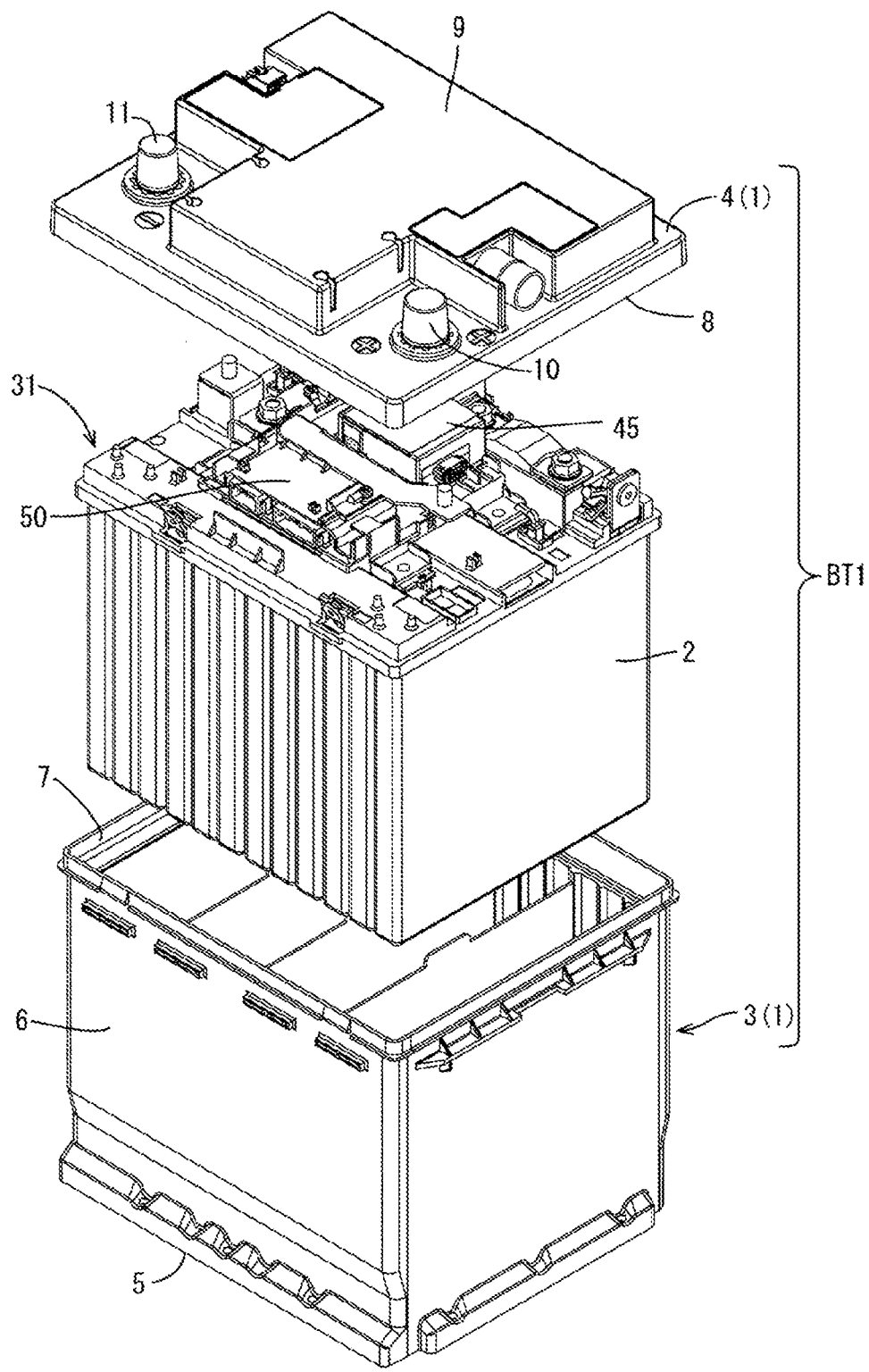
FIG. 2 is an exploded perspective view of a battery.

FIG. 1 is a side view of a vehicle VH, and FIG. 2 is an exploded perspective view of a battery BT1. The vehicle VH is an engine-driven vehicle. The vehicle VH includes the battery BT1 that is an energy storage apparatus. As shown in FIG. 2, the battery BT1 includes a housing 1, an assembled battery 40 housed inside the housing 1, and a circuit board unit 31. The Battery BT1 is used to start an engine 100 mounted on the vehicle VH.

The housing 1 includes a main body 3 and lid 4 made of a synthetic resin material. The main body 3 has a bottomed tubular shape, and includes a bottom surface portion 5 that is rectangular in plan view and four side surface portions 6 that stand up from four sides of the bottom surface portion 5 to form a tubular shape. An upper opening 7 is formed in an upper end portion by the four side surface portions 6.

The lid 4 has a rectangular shape in plan view, and a frame 8 extends downward from four sides of the lid 4. The lid 4 closes the upper opening 7 of the main body 3. An upper surface of the lid 4 has a protruding portion 9 that is substantially T-shaped in plan view. On the upper surface of the lid 4, of two parts not having the protruding portion 9, a positive external terminal 10 is fixed to one corner portion, and a negative external terminal 11 is fixed to the other corner portion. The housing 1 houses a secondary battery 2 and the circuit board unit 31. The circuit board unit 31 is arranged above the secondary battery 2.

Figure 3:
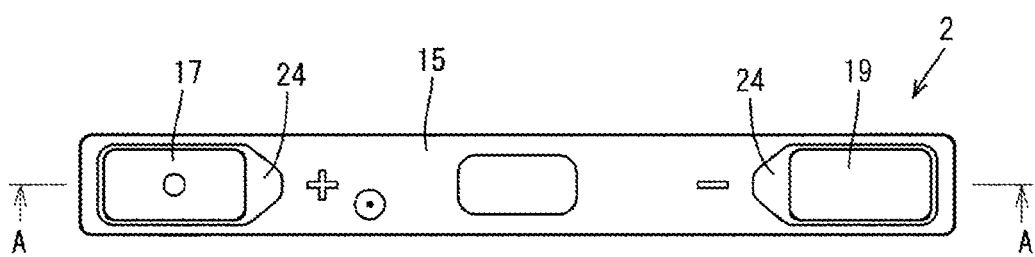
FIG. 3(*a*) is a plan view of a secondary battery shown in FIG. 2, and FIG. 3(*b*) is a sectional view taken along line A-A of FIG. 3(*a*).
Figure 3:
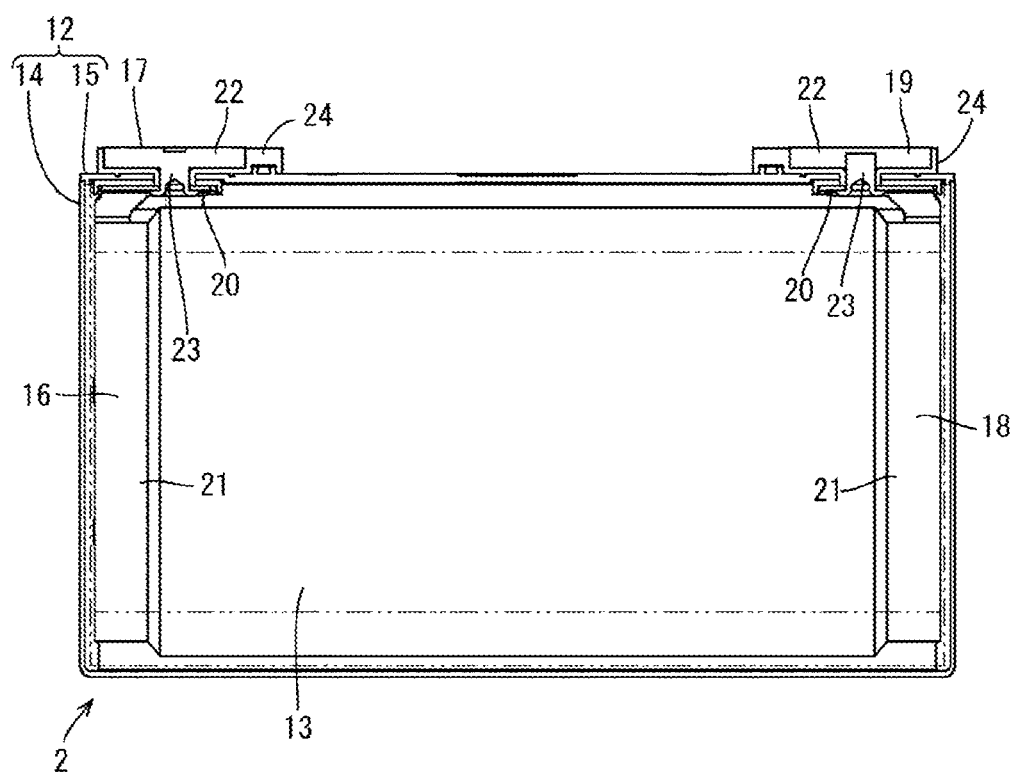

As shown in FIGS. 3(a) and 3(b), a secondary battery 2 has an electrode assembly 13 housed together with a non-aqueous electrolyte in a rectangular parallelepiped case 12. The case 12 has a case body 14 and a cover 15 that closes an upper opening of the case body 14.

Although not shown in detail, the electrode assembly 13 has a separator made of a porous resin film between a negative electrode element in which a substrate made of copper foil is coated with an active material and a positive electrode element in which a substrate made of aluminum foil is coated with an active material. The parts are all strip-shaped, and are wound in a flat shape so that they can be accommodated in the case body 14 in a state where the negative electrode element and the positive electrode element are shifted to opposite sides in the width direction from the separator.

A positive electrode terminal 17 is connected to the positive electrode element through a positive electrode current collector 16, and a negative electrode terminal 19 is connected to the negative electrode element through a negative electrode current collector 18. Each of the positive electrode current collector 16 and the negative electrode current collector 18 includes a seat portion 20 having a flat plate shape and a leg portion 21 extending from the seat portion 20. A through hole is formed in the seat portion 20. The leg portion 21 is connected to the positive electrode element or the negative electrode element. The positive electrode terminal 17 and the negative electrode terminal 19 each includes a terminal body portion 22 and a shaft portion 23 protruding downward from a center portion of a lower surface of the terminal body portion 22. Among the parts, the terminal body portion 22 and the shaft portion 23 of the positive electrode terminal 17 are integrally formed of aluminum (single material). In the negative electrode terminal 19, the terminal body portion 22 is made of aluminum and the shaft portion 23 is made of copper, and these are assembled. The terminal body portions 22 of the positive electrode terminal 17 and the negative electrode terminal 19 are arranged in both end portions of the cover 15 with gaskets 24 made of an insulating material interposed therebetween, and are exposed outward of the gaskets 24.

Figure 4:
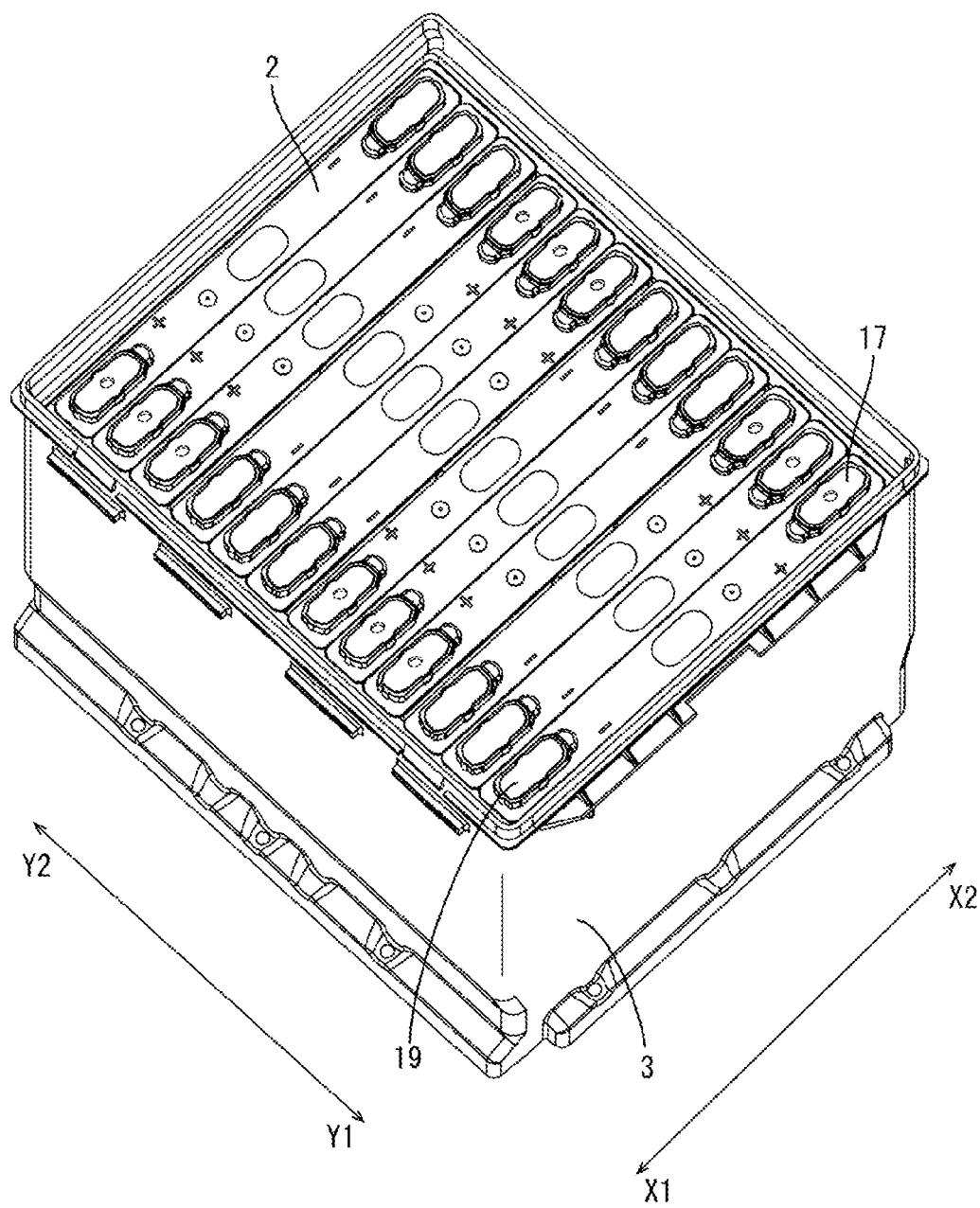
FIG. 4 is a perspective view showing a state where the secondary batteries are housed in a main body of FIG. 2.

As shown in FIG. 4, the secondary battery 2 having the above-described configuration is housed in the main body 3 in a state where multiple (for example, twelve) secondary batteries 2 are arranged side by side in the width direction. Three secondary batteries 2 from one end side toward the other end side of the main body 3 (direction of arrow Y1 to Y2) form one set. The secondary batteries 2 are arranged such that adjacent secondary batteries 2 of the same set have the same terminal polarities, while adjacent secondary batteries 2 of adjacent sets have opposite terminal polarities. In the three secondary batteries 2 (first set) located closest to the arrow Y1 side, the arrow X1 side is the negative electrode and the arrow X2 side is the positive electrode. In the three secondary batteries 2 (second set) adjacent to the first set, the arrow X1 side is the positive electrode and the arrow X2 side is the negative electrode. A third set adjacent to the second set has the same arrangement as the first set, and a fourth set adjacent to the third set has the same arrangement as the second set.

Figure 5:
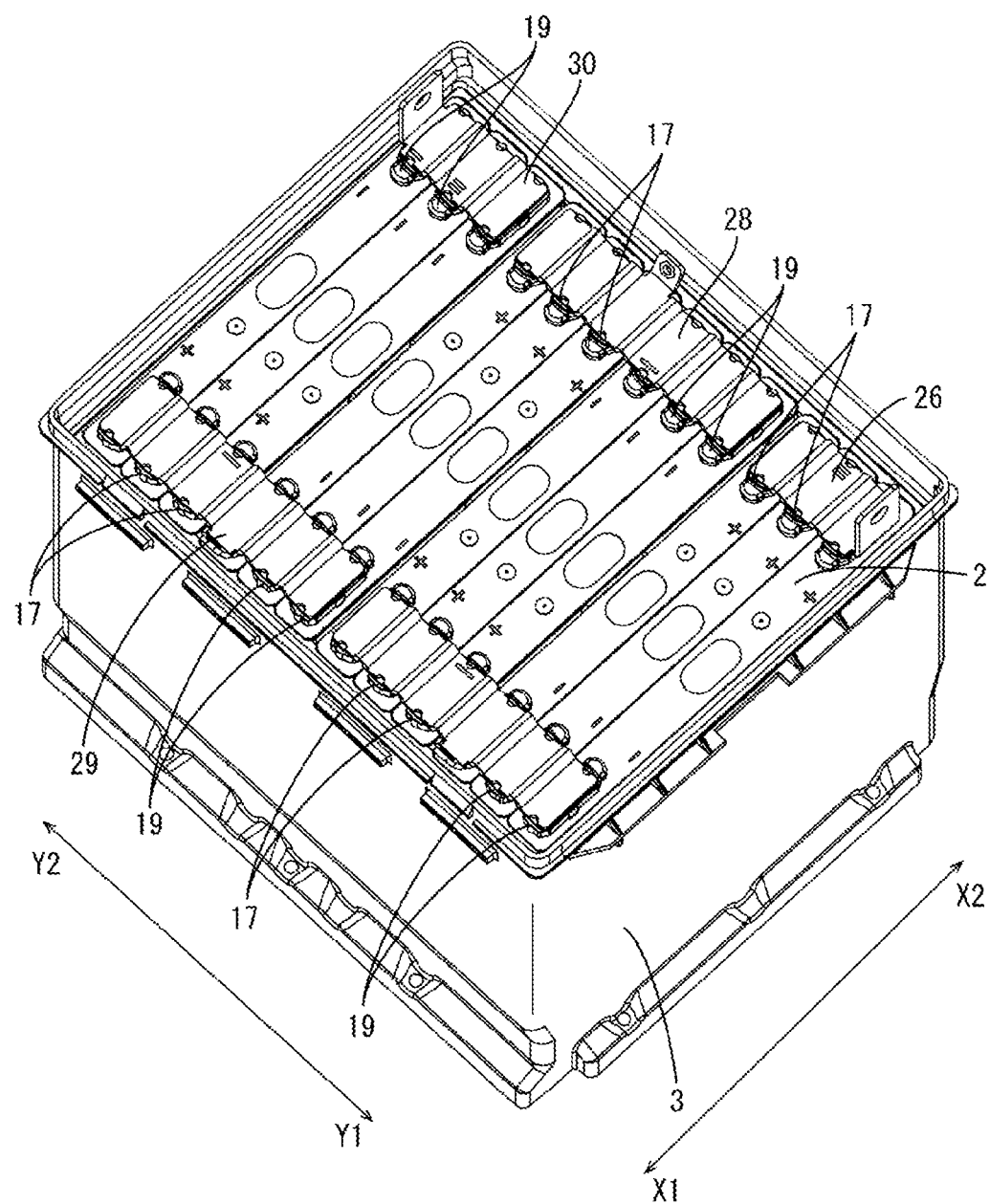
FIG. 5 is a perspective view showing a state where bus bars are attached to the secondary batteries of FIG. 4.

As shown in FIG. 5, terminal bus bars 26 to 30 as conductive members are connected to the positive electrode terminals 17 and the negative electrode terminals 19 by welding. On the arrow X2 side of the first set, a group of positive electrode terminals 17 is connected by the first bus bar 26. Between the first set and the second set, a group of negative electrode terminals 19 of the first set and a group of positive electrode terminals 17 of the second set are connected by the second bus bar 27 on the arrow X1 side. Between the second set and the third set, a group of negative electrode terminals 19 of the second set and a group of positive electrode terminals 17 of the third set are connected by the third bus bar 28 on the arrow X2 side. Between the third set and the fourth set, a group of negative electrode terminals 19 of the third set and a group of positive electrode terminals 17 of the fourth set are connected by the fourth bus bar 29 on the arrow X1 side. On the arrow X2 side of the fourth set, a group of negative electrode terminals 19 is connected by the fifth bus bar 30.

The secondary batteries 2 are connected in parallel in the same set, and are connected in series between different sets. Accordingly, the twelve secondary batteries 2 are arranged so that four sets of three parallel-connected batteries are connected in series. The secondary battery 2 is a lithium ion secondary battery, for example.

The first bus bar 26 that connects the group of positive electrode terminals of the first set is connected to the positive external terminal 10, and the fifth bus bar 30 that connects the group of negative electrode terminals of the fourth set is connected to the negative external terminal 11.

2. Description of Electrical Configuration of Battery BT1

Figure 6:
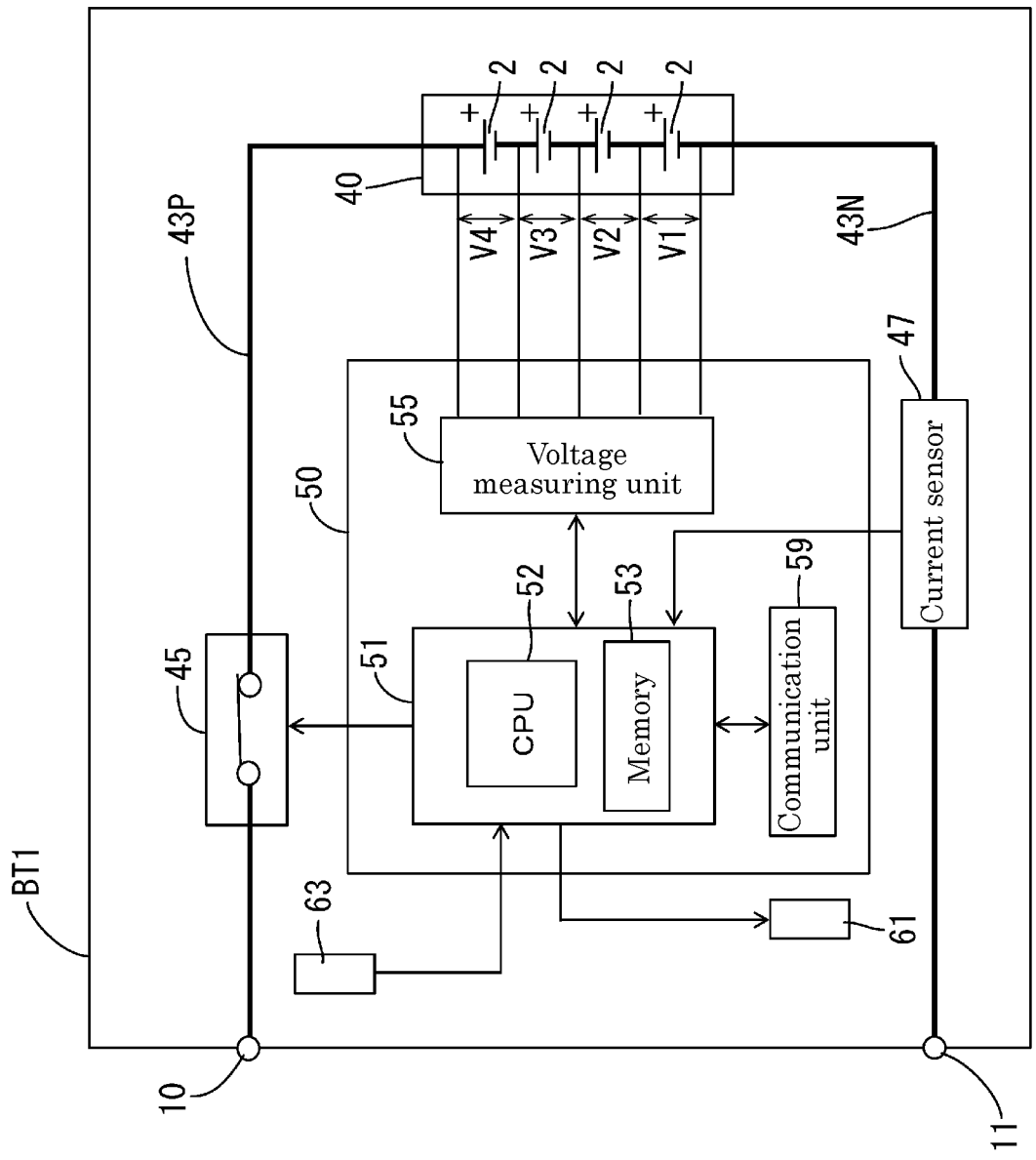
FIG. 6 is a block diagram of the battery.

FIG. 6 is a block diagram showing an electrical configuration of the battery BT1. The battery BT1 includes the assembled battery 40, a breaker 45, a current sensor 47, a management device 50, a warning lamp 61, and an external switch 63.

The assembled battery 40 includes four sets of secondary batteries 2 connected in series. The breaker 45, the assembled battery 40, and the current sensor 47 are connected in series through conduction paths 43P and 43N. The breaker 45 is arranged on the positive electrode side of the assembled battery 40 and the current sensor 47 is arranged on the negative electrode side of the assembled battery 40. The breaker 45 is connected to the positive external terminal 10 through the conduction path 43P, and the current sensor 47 is connected to the negative external terminal 11 through the conduction path 43N.

The breaker 45 is arranged on the circuit board unit 31. The breaker 45 is a relay having mechanical contacts, and interrupts the current by opening the conduction path 43P of the assembled battery 40.

The current sensor 47 is arranged on the circuit board unit 31. The current sensor 47 is connected to the management device 50 through a signal line, and a measured value I of the current sensor 47 is input to the management device 50.

The management device 50 is arranged on the circuit board unit 31. The management device 50 includes a processing unit 51, a voltage measuring unit 55, and a communication unit 59. The management device 50 is an example of a "diagnostic device".

The voltage measuring unit 55 measures voltages V1 to V4 of the secondary batteries 2 and a total voltage Vt of the assembled battery 40. The voltage measuring unit 55 outputs the data of the measured voltages V1 to V4 and Vt to the processing unit 51.

$$Vt = V1 + V2 + V3 + V4$$

The processing unit 51 includes a CPU (central processing unit) 52 and a non-volatile memory 53. The processing unit 51 monitors the state of the assembled battery 40. The processing unit 51 monitors whether or not the total voltage Vt of the assembled battery 40 and the battery voltages V1 to V4 of the secondary batteries 2 are within the usable range. The processing unit 51 monitors whether or not the current I of the assembled battery 40 is within the limit value, on the basis of the measured value I measured by the current sensor 47.

The memory 53 stores pieces of data for the processing unit 51 to monitor the state of the assembled battery 40, perform external short circuit monitoring processing (FIG. 9) described later, and the like.

Figure 7:
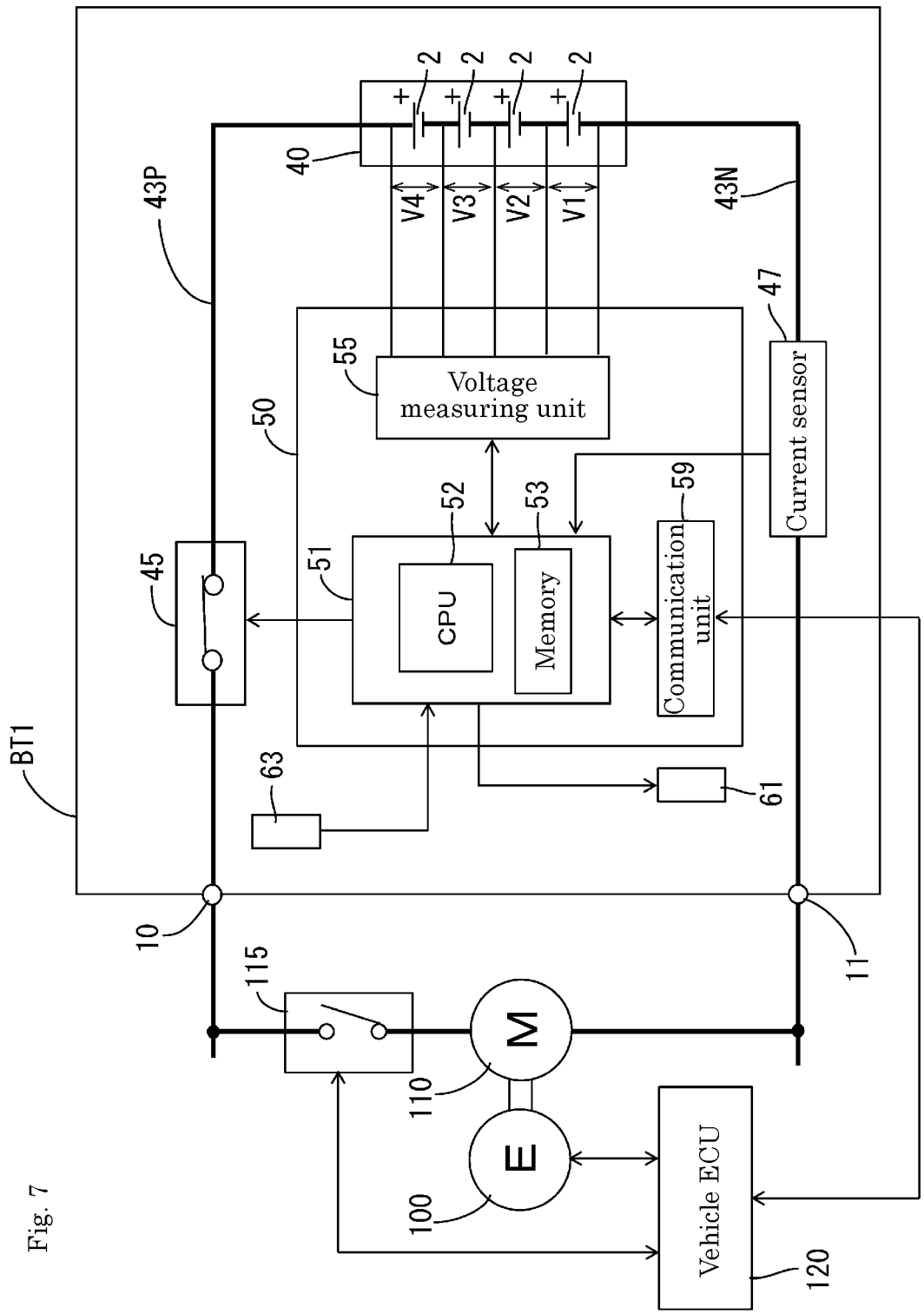
FIG. 7 is a block diagram of the battery when connected to the vehicle.

FIG. 7 is a block diagram of the battery BT1 when mounted on a vehicle. A starter motor 110 is connected to the external terminals 10 and 11 of the battery BT1 through an IG switch (ignition switch) 115. The starter motor 110 is a starting device for the engine 100 mounted on the vehicle VH. When the IG switch 115 is turned on, current flows from the battery BT1 to the starter motor 110, and the starter motor 110 rotates. As a result, a crankshaft rotates and the engine 100 starts.

A vehicle ECU (electronic control unit) 120 is mounted on the vehicle VH and monitors the operating state of engine 100, the state of the IG switch 115, and the like.

The management device 50 is communicably connected to the vehicle ECU 120 through a communication line L. The management device 50 can receive information on the operating state of the engine 100 and the operating state of the IG switch 115 from the vehicle ECU 120 by communication through the communication line L.

Figure 8:
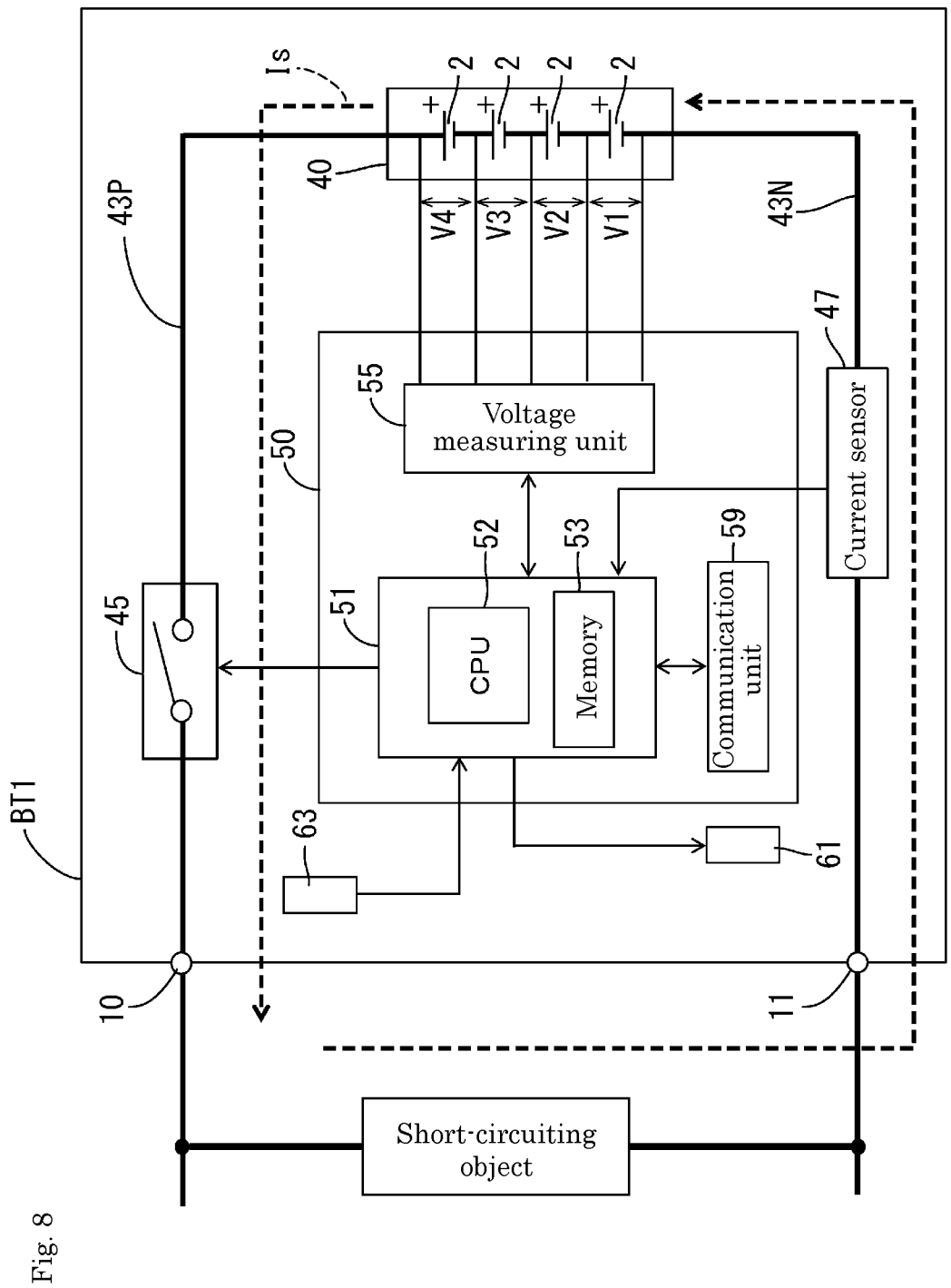
FIG. 8 is a block diagram of the battery at the time of an external short circuit.

3. Current Interruption and Damage Diagnosis of Breaker at Time of External Short Circuit When installing or replacing the battery BT1 of the vehicle VH, a metal tool or the like may come into contact with the two external terminals 10 and 11 of the battery BT1 and the battery BT1 may be externally short-circuited. When an external short circuit occurs, a short-circuit current Is flows through a path indicated by a chain line in FIG. 8. The short-circuit current Is is a large current of about 5000 A, for example. From the occurrence of the external short circuit until the breaker 45 interrupts the current, the short-circuit current Is flows through the breaker 45, and the breaker 45 is damaged.

Figure 9:
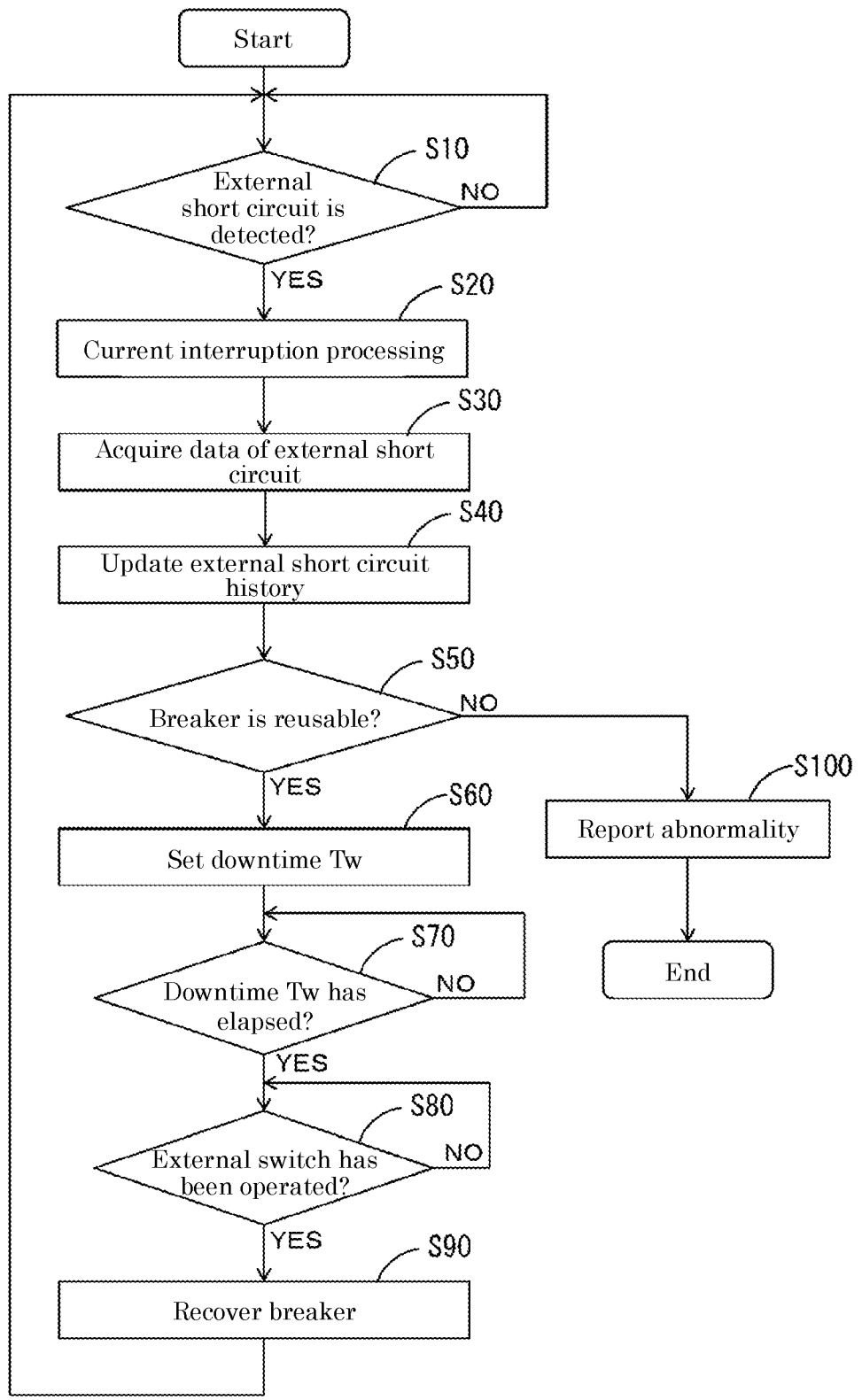
FIG. 9 is a flowchart showing a flow of external short circuit monitoring processing.

FIG. 9 is a flowchart showing a flow of external short circuit monitoring processing performed by the management device 50. The breaker 45 is controlled to be in a closed state when there is no abnormality in the battery BT1 (external short circuit or the like has not occurred).

The external short circuit monitoring processing is configured of ten steps S10 to S100. The CPU 52 first performs processing of detecting whether or not there is an external short circuit (S10). Whether or not there is an external short circuit can be detected by comparing the measured value I of the current sensor 47 with a threshold value X.

The threshold value X is a value larger than the maximum value of the current measured during normal use (e.g., cranking current), and is 2000 A, for example.

Figure 10:
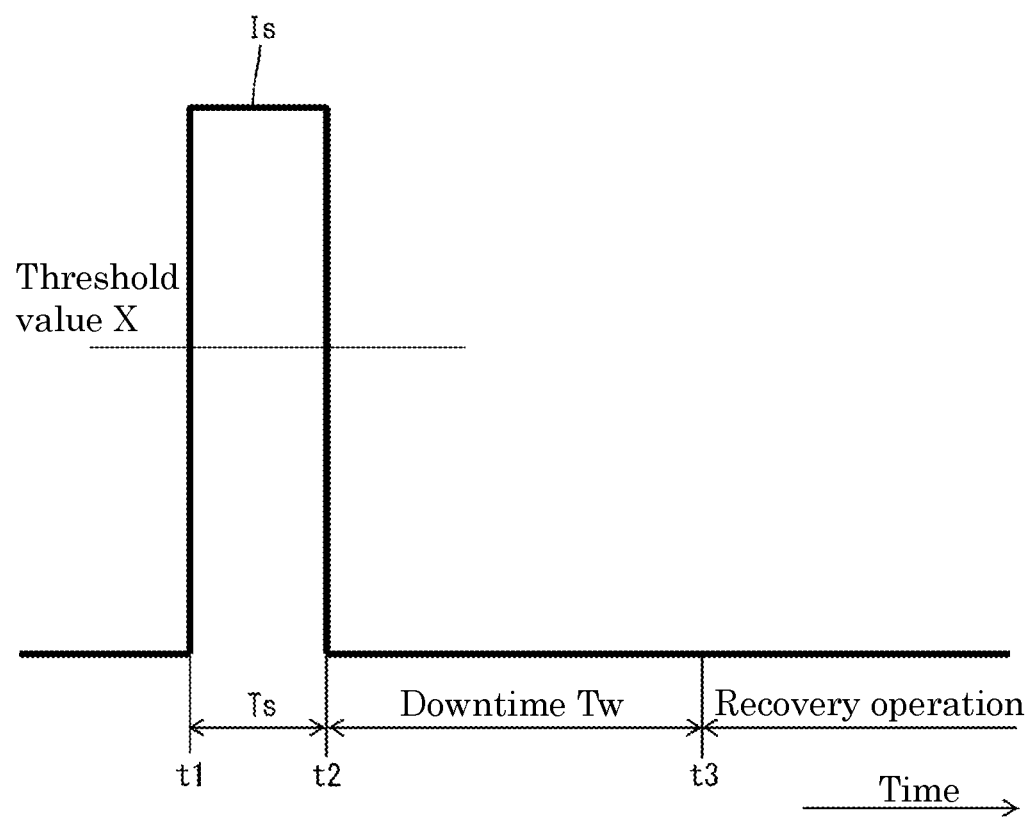
FIG. 10 is a current waveform at the time of an external short circuit.

FIG. 10 shows a waveform of a current at the time of occurrence of an external short circuit. Reference sign t1 shown in FIG. 10 represents a time when the external short circuit is detected. Upon detection of an external short circuit, the CPU 52 performs current interruption processing (S20). The CPU 52 sends an interruption command to the breaker 45 to switch the breaker 45 from close to open.

Reference sign t2 shown in FIG. 10 represents a timing at which the breaker 45 switches from close to open. The CPU 52 can use the breaker 45 to interrupt the short-circuit current Is due to the external short circuit, by switching the breaker 45 from close to open. Time t1 to t2 shown in FIG. 10 is a first time Ts from detection to interruption of the external short circuit.

The CPU 52 acquires data of the external short circuit after the current interruption processing (S30). The data of the external short circuit is the first time Ts and the magnitude of the short-circuit current Is.

The short-circuit current Is can be measured by the current sensor 47. The first time Ts is "the time during which the short-circuit current Is flowed through the breaker 45". The first time Ts is a time obtained by adding, to the reaction time until the CPU 52 sends an interruption command to the breaker 45 after detection of the external short circuit, the operating time of the breaker 45 (time from receipt of interruption command until contact actually opens). An empirical value can be used as the first time Ts. The first time Ts may be obtained from the current waveform measured by the current sensor 47.

Figure 11:
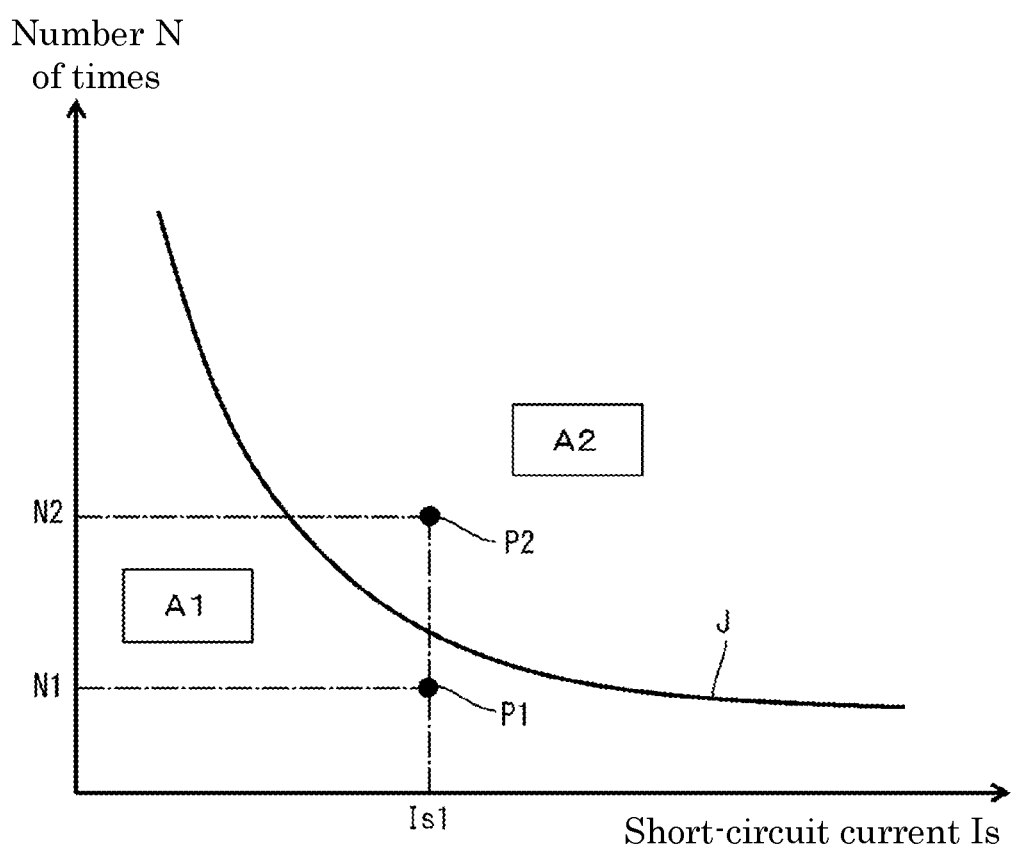
FIG. 11 is a graph showing a determination curve J.

Thereafter, the CPU 52 performs processing of updating an external short circuit history (S40). The external short circuit history is configured of the following three pieces of information and is recorded in the memory 53.

a) Number (cumulative number) N of external short circuits
 b) Magnitude of short-circuit current Is for each external short circuit
 c) First time Ts of short-circuit current for each external short circuit After updating the external short circuit history, the CPU 52 determines whether or not the breaker 45 is reusable (S50). Whether or not the breaker 45 is reusable is determined by the number N of external short circuits and the magnitude of the short-circuit current Is. FIG. 11 is a determination curve J for determining whether or not the breaker 45 is reusable. The determination curve J is a graph in which the horizontal axis represents the short-circuit current Is and the vertical axis represents the number N of external short circuits. Data of the determination curve J is stored in the memory 53.

The CPU 52 can read the data of the number N of external short circuits and the magnitude of the short-circuit current Is for each external short circuit as the data of the external short circuit history from the memory 53, and refer to the determination curve J to determine whether or not the breaker 45 is reusable.

For example, when data P of the read history is in an area A1 on the inner side of the determination curve, the CPU 52 determines that the breaker 45 has small damage, the breaker 45 is not likely to fail, and is reusable. On the other hand, when the read data P is in an area A2 on the outer side of the determination curve, the CPU 52 determines that the breaker 45 has large damage, the breaker 45 may fail, and is not reusable.

In P1 shown in FIG. 11, the short-circuit current is Is1, the number of times is N1, and P1 is included in the area A1 on the inner side of the determination curve J. Hence, the CPU 52 determines that the breaker 45 is reusable. On the other hand, in P2 shown in FIG. 11, the short-circuit current is Is1, the number of times is N2, and P2 is included in the area A2 on the outer side of the determination curve J. Hence, the CPU 52 determines that the breaker 45 is not reusable.

As described above, even if the magnitude of the short-circuit current Is is the same, if the number N of external short circuits increases, the CPU 52 determines that the breaker 45 is not reusable. When the short-circuit current Is is large, the CPU 52 determines that the breaker 45 is not reusable after a small number N of times.

If it is determined that the breaker 45 is reusable (S50: YES), the CPU 52 performs processing of setting a downtime Tw (S60). The downtime Tw is a time during which a switching operation (switching between open and close) of the breaker 45 is stopped after interruption of the current (time t2 shown in FIG. 10).

The downtime Tw is set on the basis of the latest short-circuit current Is and first time Ts. The CPU 52 uses the short-circuit current Is and the first time Ts to calculate a heat generation amount Q of the breaker 45 on the basis of equation (1). The downtime Tw is set to be longer for a larger heat generation amount Q.

$$Q = R \times Is^2 \times Ts \quad (1)$$

Reference sign R represents the electrical resistance of the breaker 45.

After setting the downtime Tw, the CPU 52 performs processing of determining whether or not the downtime Tw has elapsed since interruption of the current (time t2 shown in FIG. 10) (S70). During the period from time t2 which is the current interruption time until the elapse of the downtime Tw, it is determined NO in S70.

When the downtime Tw elapses (time t3 shown in FIG. 10), the CPU 52 determines whether or not the external switch 63 has been operated (S80). The external switch 63 is a switch operated by the user to reuse the battery BT1 when the external short circuit is cancelled (when tool or the like that short-circuits terminals is removed).

If the external switch 63 has not been operated after the occurrence of the external short circuit, the CPU 52 goes into a standby state (S80: NO).

Upon detection of an operation of the external switch 63 (S80: YES), the CPU 52 performs recovery processing of the breaker 45 (S90).

The recovery processing is processing of sending a recovery command to the breaker 45 and switching the breaker 45 from open to close. As a result, the battery BT1 returns to the state before occurrence of the external short circuit and returns to a usable state.

If it is determined that the breaker 45 is not reusable (S50: NO), the CPU 52 keeps the breaker 45 open to prohibit recovery, and at the same time, lights the warning lamp 61 to report the abnormality to the outside (S100).

4. Effect

The CPU 52 diagnoses the damage to the breaker 45 and determines whether or not the breaker 45 is reusable. Hence, it is possible to curb reuse of the breaker 45 that is greatly damaged and not suitable for use.

Since the damage diagnosis element includes not only the short-circuit current Is but also the number N of external short circuits, the CPU 52 can diagnose the accumulation of damage in the breaker 45.

By performing the recovery operation of the breaker 45 after the elapse of the downtime Tw, the CPU 52 can reduce failure of the breaker 45 due to temporary heat generation. It is possible to keep the contact having generated heat due to the short-circuit current Is from sticking by the recovery operation.

The lithium ion secondary battery 2 has a smaller internal resistance than a lead-acid battery, and a large current tends to flow at the time of an external short circuit. For this reason, the breaker 45 used for the lithium ion secondary battery 2 is easily damaged and use of the unsuitable breaker 45 is continued in some cases. By applying the present technology, it is possible to diagnose damage to the breaker 45, and when it is determined that the breaker 45 is not reusable, the CPU 52 can perform a treatment according to the damage, such as reporting an abnormality.

The breaker 45 is provided in the conduction path 43P that connects the external terminal 10 and the positive electrode of the assembled battery 40. Hence, by prohibiting use of the breaker 45 when the breaker 45 is damaged, the entire battery BT1 including the assembled battery 40 can be protected.

Embodiment 2

Figure 12:
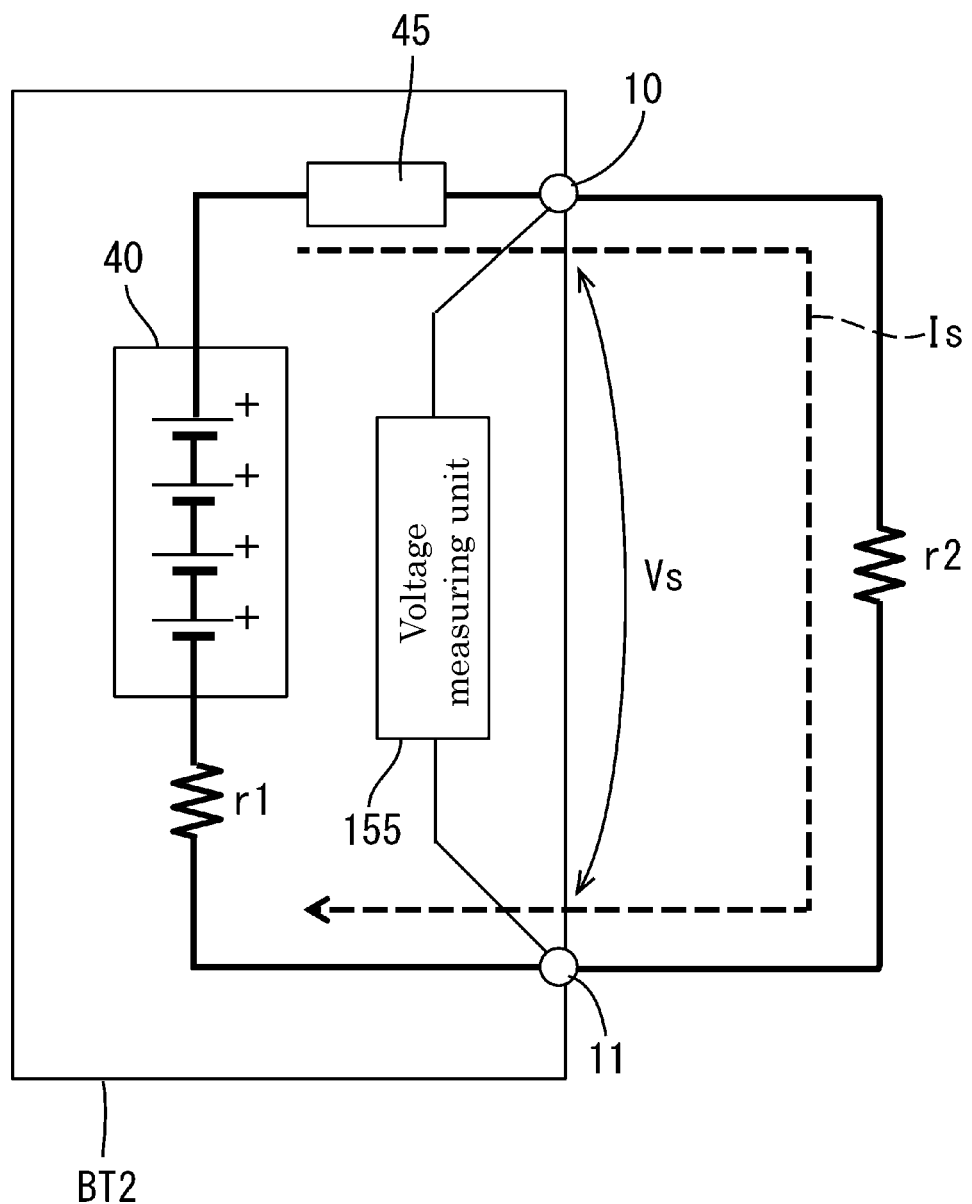
FIG. 12 is a diagram showing the calculation principle of a short-circuit current.

A battery BT2 of Embodiment 2 has a voltage measuring unit 155 that measures an inter-terminal voltage Vs of external terminals 10 and 11. FIG. 12 is a diagram showing the principle of calculating a short-circuit current Is, where r1 represents the internal resistance of an assembled battery 40 and r2 represents the short-circuit resistance.

A voltage difference ΔVs between an inter-terminal voltage Vs1 when there is no current and an inter-terminal voltage Vs2 when there is an external short circuit is proportional to the magnitude of the short-circuit current Is and the magnitude of the internal resistance r1 of the assembled battery 40. A no current state may be a state where the current is a predetermined value or less, and includes a case where it can be considered that there is no current.

$$\Delta Vs = Vs1 - Vs2 \quad (2)$$

$$\Delta Vs = Is \times r1 \quad (3)$$

Accordingly, a CPU 52 can obtain the short-circuit current Is from the voltage difference ΔVs and the internal resistance r1. The short-circuit current Is is a large current and cannot be measured by a current sensor 47 when it exceeds the measurement range of the current sensor 47. In Embodiment 2, the short-circuit current Is can be measured without using the current sensor 47, which is effective when the current sensor 47 cannot measure the short-circuit current.

The internal resistance r1 can be obtained from data of the current I and the inter-terminal voltage Vs of the battery BT2 during normal use (slope of I-Vs curve). In addition to these, experimental values and theoretical values can be used.

Third Embodiment

Figure 13:
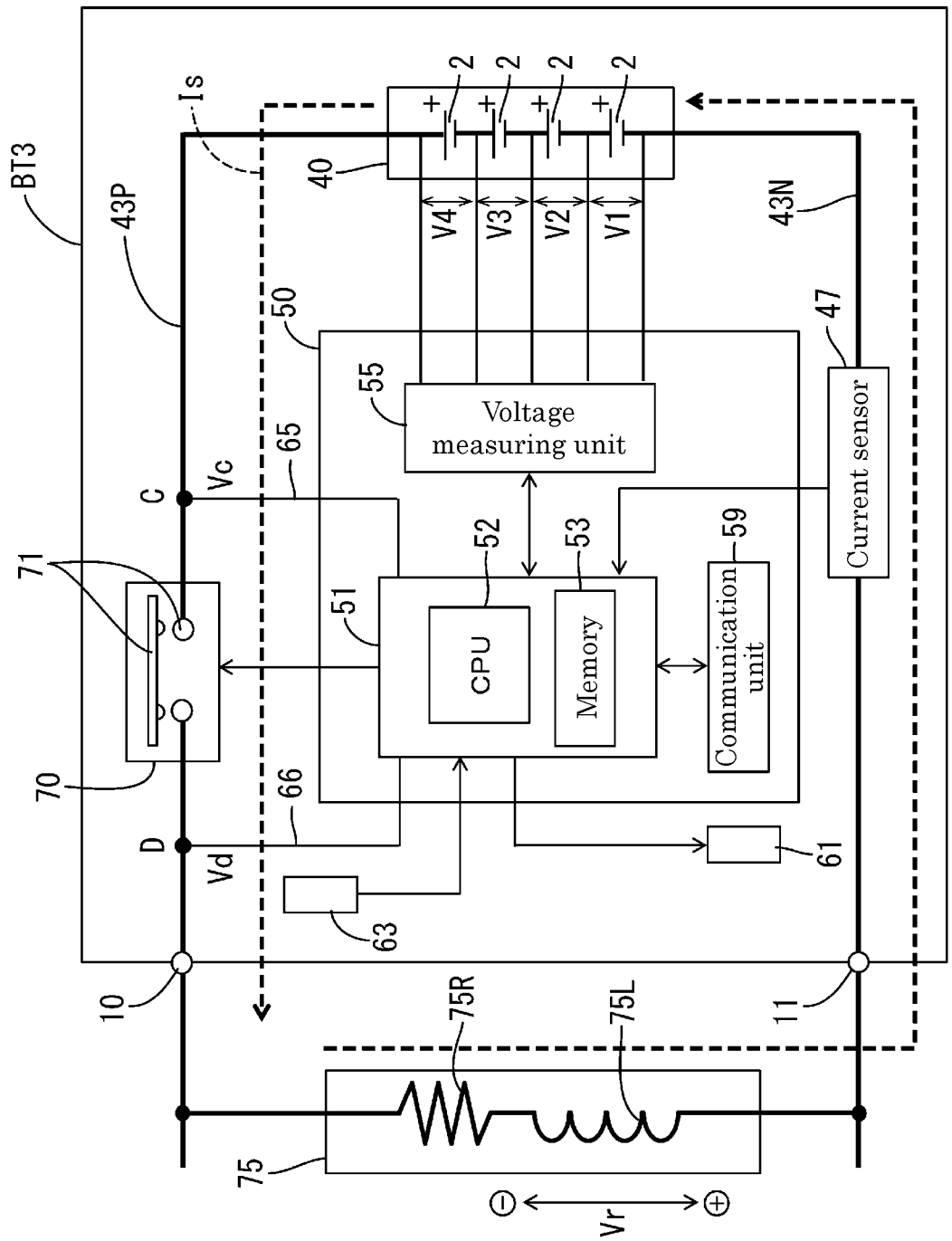
FIG. 13 is a block diagram of a battery.

FIG. 13 is a block diagram of a battery BK3. The battery BK3 has a relay 70. The relay 70 is located in a conduction path 43P. The relay 70 has mechanical contacts 71. The relay 70 is a breaker that interrupts a current I by opening the conduction path 43P of an assembled battery 40. A management unit 51 is connected to points C and D at both ends of the relay by a signal line 65 and a signal line 66, respectively, and can detect a voltage Vc at point C and a voltage Vd at point D. Point C is the voltage of the positive electrode of the assembled battery 40, and point D is the voltage of an external terminal 10. Vc-Vd is the voltage across the relay 70.

Figure 14:
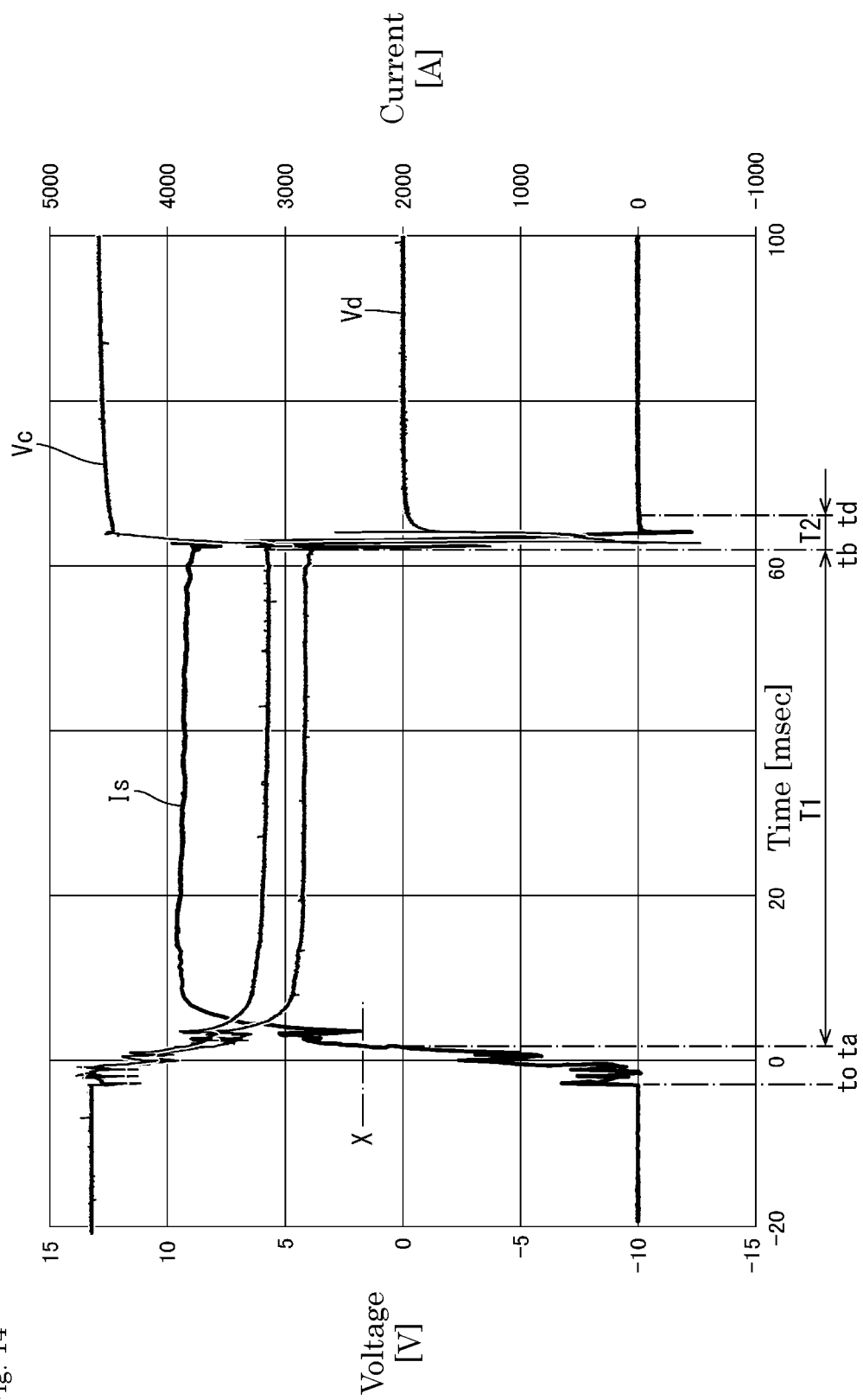
FIG. 14 is a waveform of current and voltage at the time of an external short circuit.

FIG. 14 shows a current waveform and a voltage waveform when the battery BT3 is short-circuited by a booster cable 75. Reference sign Is represents a short-circuit current. Reference sign Vc represents a voltage at point C (voltage of assembled battery 40). Reference sign Vd represents a voltage at point D (voltage of external terminal 10). The booster cable 75 is an electric cable that electrically connects an external charger and the battery when charging.

Reference sign t0 represents a time when a short circuit occurs, and reference sign ta represents a time when a short circuit is detected. Detected time is a time when a CPU 52 detects that the short-circuit current Is exceeds a threshold value X. Reference sign tb represents a time when the short-circuit current Is is interrupted. Interrupted time is a time when the relay 70 opens and the short-circuit current Is is interrupted. A first time T1 is a time (ta to tb) from detection to interruption of the short circuit. The first time T1 is the sum of reaction time and operation time. Reaction time is a time from when the CPU 52 detects a short circuit to when the CPU 52 sends an interruption command to the relay 70. Operation time is a time from when the interruption command is sent to when the relay 70 is actually opened.

During the first time T1, the short-circuit current Is exceeding the threshold value X flows through the relay 70. The relay 70 generates heat and is damaged by the short-circuit current Is of the first time T1.

The booster cable 75 has a resistance component 75R and an inductance component 75L. When the relay 70 is opened, the inductance component 75L generates a counter electromotive force Vr.

The counter electromotive force Vr pulls the external terminal 10 to a negative voltage. Hence, a large voltage may be applied to both ends of the relay 70, and arc discharge may occur between the contacts 71 of the relay 70.

Figure 15:
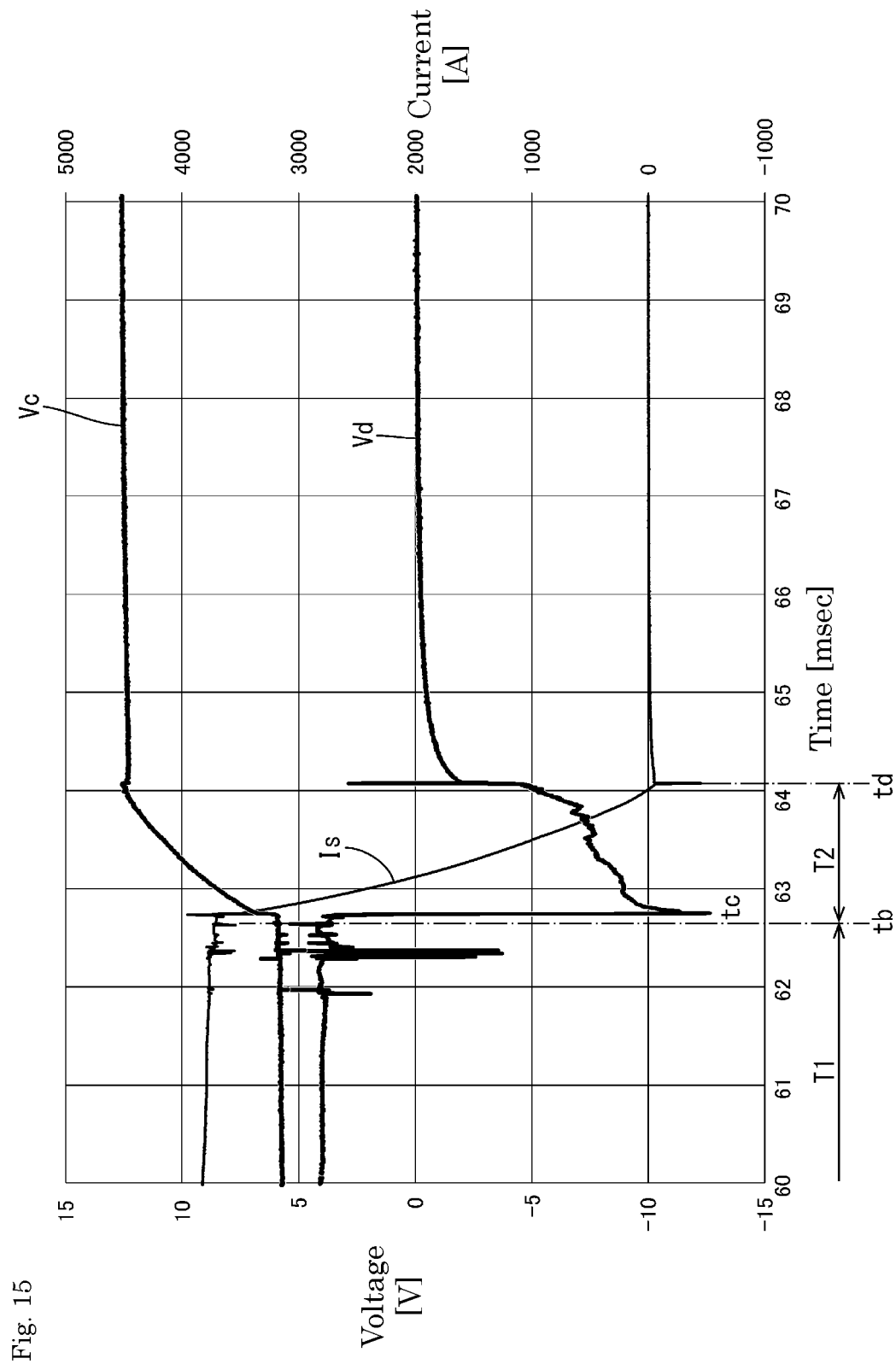
FIG. 15 is an enlarged view of FIG. 14.

FIG. 15 is an enlarged view of FIG. 14. The sudden negative change of Vd after tb is attributable to the influence of the counter electromotive force Vr due to the inductance component 75L. Reference sign tc represents a time of occurrence of arc discharge.

The short-circuit current Is decreases almost linearly after the arc discharge and converges at time td. A second time T2 from tb to td is a time from interruption to convergence of the short circuit. That is, the second time T2 is a time from when the relay 70 opens until the short-circuit current Is converges. Convergence means that the short-circuit current Is drops to zero [A] which is the convergence value. During the second time T2, electric energy stored in the inductance component is replaced with heat by arc discharge, and is consumed by the relay 70. The relay 70 generates heat and is damaged by the current Is of the second time T2.

The CPU 52 diagnoses damage to the relay 70 from a heat generation amount Q1 of the relay 70 during the first time T1 and a heat generation amount Q2 of the relay 70 during the second time T2.

The heat generation amount Q1 of the relay 70 during the first time T1 can be estimated on the basis of an average current Is1 during the first time T1, an average voltage difference ΔV1 between C and D during the first time T1, and the first time T1. Equation (4) is an exemplar equation. The first time T1 may be a measured value, an experimental value, or an empirical value.

$$Q1 = Is1 \times \Delta V1 \times T1 \quad (4)$$

$$\Delta V1 = Vc - Vd \quad (5)$$

The heat generation amount Q2 of the relay 70 during the second time T2 can be estimated on the basis of an average current Is2 during the second time T2, an average voltage ΔV2 between C and D during the second time T2, and the second time T2. Equation (6) is an exemplar equation. The average current Is2 during the second time T2 may be ½ of the average current Is1 during the first time T1, as shown in equation (8). The second time T2 may be a measured value, an experimental value, or an empirical value. When measuring, the second time T2 may be obtained from a current waveform measured by a current sensor 47.

$$Q2 = Is2 \times \Delta V2 \times T2 \quad (6)$$

$$\Delta V2 = Vc - Vd \quad (7)$$

$$Is2 = Is1/2 \quad (8)$$

When a total heat generation amount Q1+Q2 of the heat generation amount Q1 and the heat generation amount Q2 is higher than a threshold value, the CPU 52 may determine that damage to the relay 70 is large (possibility of failure). When the total heat generation amount Q1+Q2 is lower than the threshold value, the CPU 52 may determine that damage to the relay 70 is small (no possibility of failure).

Fourth Embodiment

Figure 16:
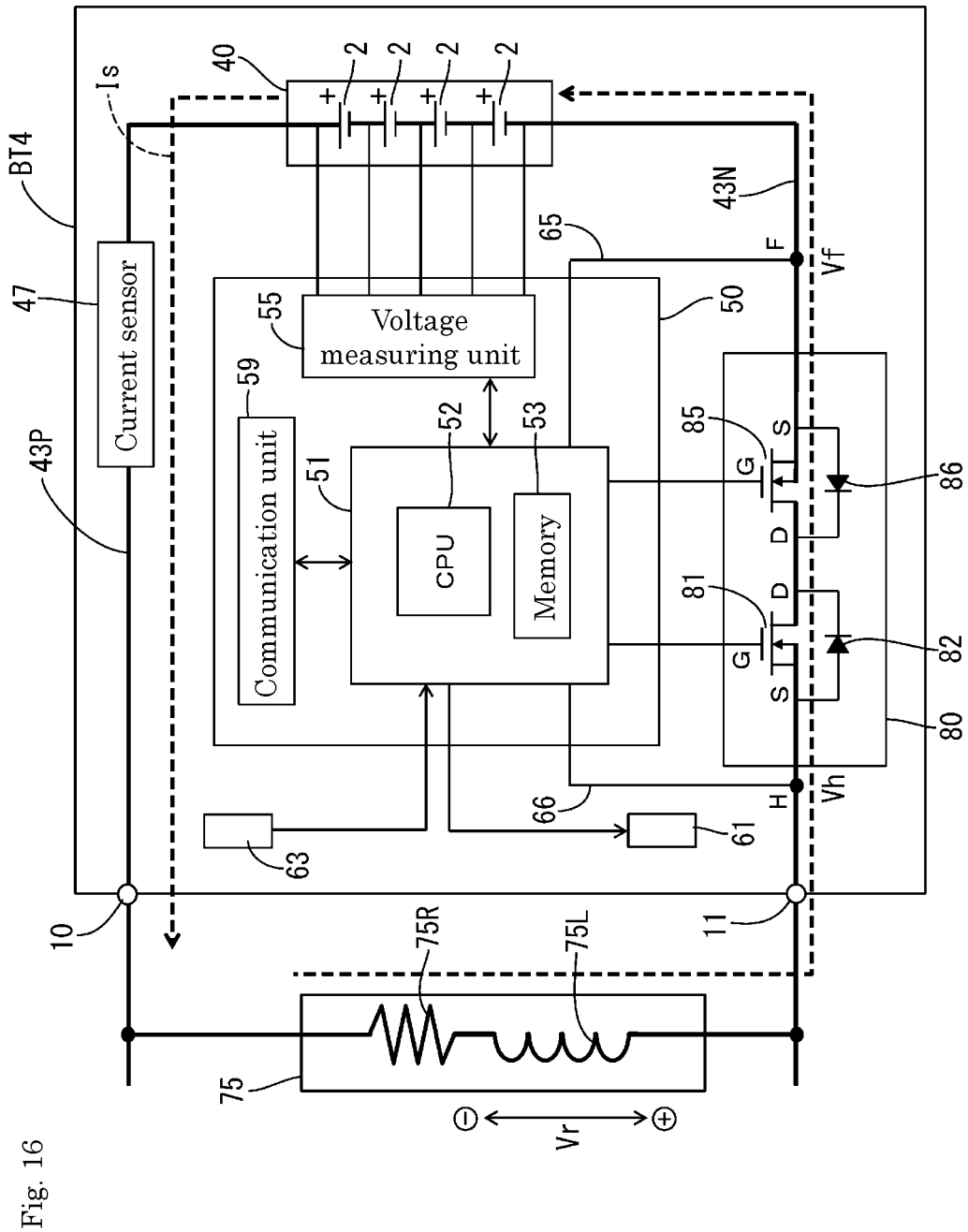
FIG. 16 is a block diagram of a battery.

FIG. 16 is a block diagram of a battery BK4. The battery BT4 has a semiconductor switch 80. The semiconductor switch 80 is located in a conduction path 43N. The semiconductor switch 80 has a first FET 81 and a second FET 85. The first FET 81 and the second FET 85 are N-channel field effect transistors. The semiconductor switch 80 is a breaker that interrupts a current I by opening the conduction path 43N of an assembled battery 40. The semiconductor switch 80 may be configured to include only the second FET 85.

The first FET 81 has a source S connected to an external terminal 11, and the second FET 85 has a source S connected to the negative electrode of the assembled battery 40. A drain D of the first FET 81 and a drain D of the second FET 85 are connected to each other. The first FET 81 and the second FET 85 are connected back to back. Back-to-back connection means connecting two FETs back to back, that is, connecting the drains of two FETs or connecting the sources of two FETs.

The first FET 81 has a built-in parasitic diode 82, and the second FET 85 has a built-in parasitic diode 86. The forward direction of the parasitic diode 82 is the same as the discharging direction. The forward direction of the parasitic diode 86 is the same as the charging direction.

The first FET 81 is turned on by applying an H level voltage to a gate G, and is turned off by applying an L level voltage to the gate G. The same applies to the second FET 85.

A CPU 52 is connected to points F and H at both ends of the semiconductor switch by signal lines 65 and 66, respectively, and can detect a voltage Vf at point F and a voltage Vh at point H. Point F is the voltage of the negative electrode of an assembled battery 40, and point H is the voltage of the external terminal 11. Vf-Vh is the voltage across the semiconductor switch 80. When the first FET 81 is ON and the second FET 85 is OFF, Vf-Vh is almost equal to a drain-source voltage Vds of the second FET 85.

The CPU 52 normally applies an H level voltage to the gate G to control the first FET 81 to be turned on. Additionally, the CPU 52 applies an H level voltage to the gate to control the second FET 85 to be turned on. When both the first FET 81 and the second FET 85 are ON, the assembled battery 40 can be charged and discharged.

Upon detection of an abnormality of the battery BT4, the CPU 52 controls charging and discharging by switching on and off the first FET 81 and the second FET 85.

Upon detection of overcharge, the CPU 52 turns off the first FET 81 and turns on the second FET 85. By turning off the first FET 81 and turning on the second FET 85, it is possible to interrupt charging and perform only discharging. In this case, the discharge current flows in the current path of the parasitic diode 82 of the first FET 81 and the drain-source of the second FET 85. The first FET 81 does not have a discharge interruption function, and is a switch that interrupts charging of the battery BT4.

Upon detection of overdischarge, the CPU 52 turns on the first FET 81 and turns off the second FET 85. By turning on the first FET 81 and turning off the second FET 85, it is possible to interrupt discharging and accept only charging. In this case, the charge current flows in the current path of the drain-source of the first FET 81 and the parasitic diode 86 of the second FET 85. The second FET 85 does not have a charge interruption function, and interrupts discharging of the battery BT4.

Upon detection of a short-circuit current Is, the CPU 52 keeps the first FET 81 ON and switches the second FET 85 from ON to OFF. By switching the second FET 85 to OFF, the short-circuit current Is can be interrupted.

Figure 17:
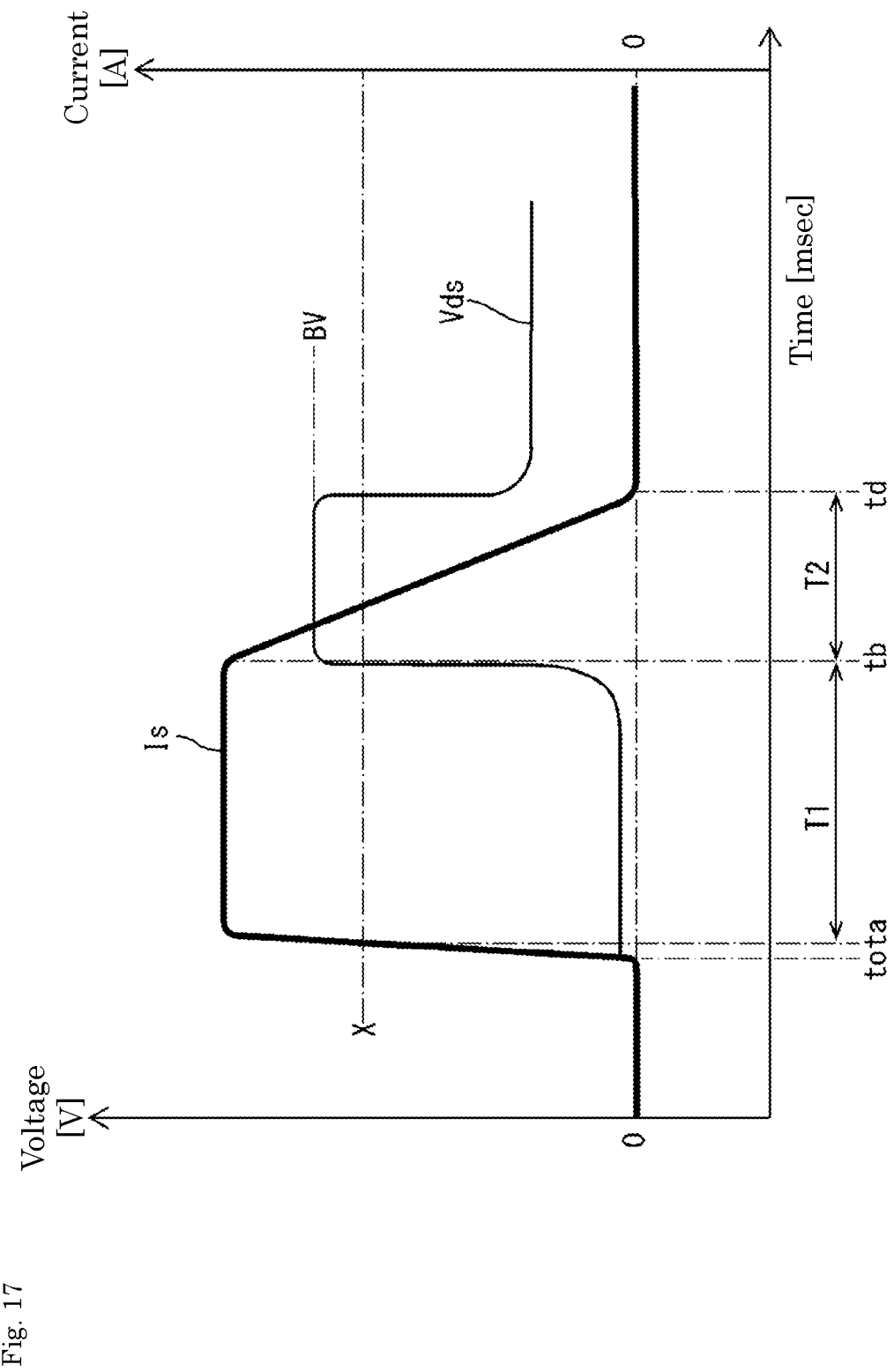
FIG. 17 is a waveform of current and voltage at the time of an external short circuit.

FIG. 17 shows a current waveform and a voltage waveform when the battery BT4 is short-circuited by a booster cable 75. Reference sign Is represents a short-circuit current. Reference sign Vds represents the drain-source voltage of the second FET 85.

Reference sign t0 represents a time when a short circuit occurs, and reference sign ta represents a time when a short circuit is detected. Detected time is a time when a CPU 52 detects that the short-circuit current Is exceeds a threshold value X. Reference sign tb represents a time when the short-circuit current Is is interrupted. Interrupted time is a time when the second FET 85 is turned off and the short-circuit current Is is interrupted. A first time T1 is a period (ta to tb) from detection to interruption of the short circuit. The first time T1 is the sum of reaction time and operation time.

During the first time T1, the short-circuit current Is exceeding the threshold value X flows through the semiconductor switch 80. The semiconductor switch 80 generates heat and is damaged by the short-circuit current Is of the first time T1.

The booster cable 75 has a resistance component 75R and an inductance component 75L. When the second FET 85 is switched from ON to OFF, the inductance component 75L generates a counter electromotive force Vr.

A large voltage is applied between the drain and source of the second FET 85 by the counter electromotive force Vr, and when the withstanding pressure is exceeded, the second FET 85 goes into avalanche breakdown. During the breakdown period, Vds of the second FET 85 maintains a breakdown voltage BV. Reference sign Vds represents the drain-source voltage.

The short-circuit current Is decreases almost linearly after the avalanche breakdown and converges at time td. A second time T2 from tb to td is a time from interruption to convergence of the short circuit. That is, the second time T2 is a time from when the second FET 85 is switched to OFF until the short-circuit current Is converges. Convergence means that the short-circuit current Is drops to zero [A] which is the convergence value. During the second time T2, electric energy stored in the inductance component 75L is replaced with heat by the current flowing through the second FET 85 due to the avalanche breakdown, and is consumed by the second FET 85. The second FET 85 generates heat and is damaged by the short-circuit current Is of the second time T2.

The CPU 52 diagnoses damage to the second FET 85 of the semiconductor switch 80 from a heat generation amount Q1 of the semiconductor switch 80 during the first time T1 and a heat generation amount Q2 of the semiconductor switch 80 during the second time T2.

The heat generation amount Q1 of the second FET 85 during the first time T1 can be estimated on the basis of an average current Is1 during the first time T1, Vds of the second FET 85 during the first time T1, and the first time T1. Equation (9) is an exemplar equation. Since the first FET 81 and the second FET 85 are both ON during the first time T1, Vds of the second FET 85 is about ½ of the measured value of the voltage Vh-Vf across the semiconductor switch 80. The first time T1 may be a measured value, an experimental value, or an empirical value.

$$Q1 = Is1 \times Vds \times T1 \quad (9)$$

The heat generation amount Q2 of the second FET 85 during the second time T2 can be estimated on the basis of an average current Is2 during the second time T2, the breakdown voltage BV of the second FET 85, and the second time T2. Equation (10) is an exemplar equation. The average current Is2 during the second time T2 may be ½ of the average current Is1 during the first time T1, as shown in equation (11). As the breakdown voltage BV, a measured value of the voltage Vh-Vf across the semiconductor switch 80 may be used, or a value on a data sheet of the second FET 85 may be used. The second time T2 may be a measured value, an experimental value, or an empirical value. When measuring, the second time T2 may be obtained from a current waveform measured by a current sensor 47.

$$Q2=Is2 \times BV \times T2 \tag{10}$$

$$Is2=Is1/2 \tag{11}$$

When a total heat generation amount Q1+Q2 of the heat generation amount Q1 and the heat generation amount Q2 is higher than a threshold value, the CPU 52 may determine that damage to the second FET 85 is large (possibility of failure). When the total heat generation amount Q1+Q2 is lower than the threshold value, the CPU 52 may determine that damage to the second FET 85 is small (no possibility of failure).

During the first time T1, the second FET 85 is conducting and the drain-source voltage Vds is small. The heat generation amount Q1 during the first time T1 is smaller than the heat generation amount Q2 during the second time T2. A processing unit 51 may determine damage to the second FET 85 only by the heat generation amount Q2 during the second time T2. The semiconductor switch 80 is easily damaged by heat generation at a joint portion of metals having different thermal expansion coefficients. It is possible to accurately diagnose damage to the semiconductor switch 80 that is easily damaged by heat generation, and curb continuous use of the failed semiconductor switch 80. In Embodiment 4, when the short-circuit current Is is detected, the first FET 81 is kept ON and the second FET 85 is switched from ON to OFF. A configuration may be adopted in which both the first FET 81 and the second FET 85 are switched from ON to OFF.

Other Embodiments

The present invention is not limited to the embodiment described with reference to the above description and drawings, and the following embodiments, for example, are also included in the technical scope of the present invention.

(1) In Embodiment 1 above, the secondary battery 2 is exemplified as an example of the energy storage device. The energy storage device is not limited to the secondary battery 2, and may be a capacitor or the like. The usage of the battery BT1 is not limited to the vehicle, and the battery BT1 may be used for other purposes such as an uninterruptible power supply system and an energy storage apparatus of a solar power generating system.

Figure 18:
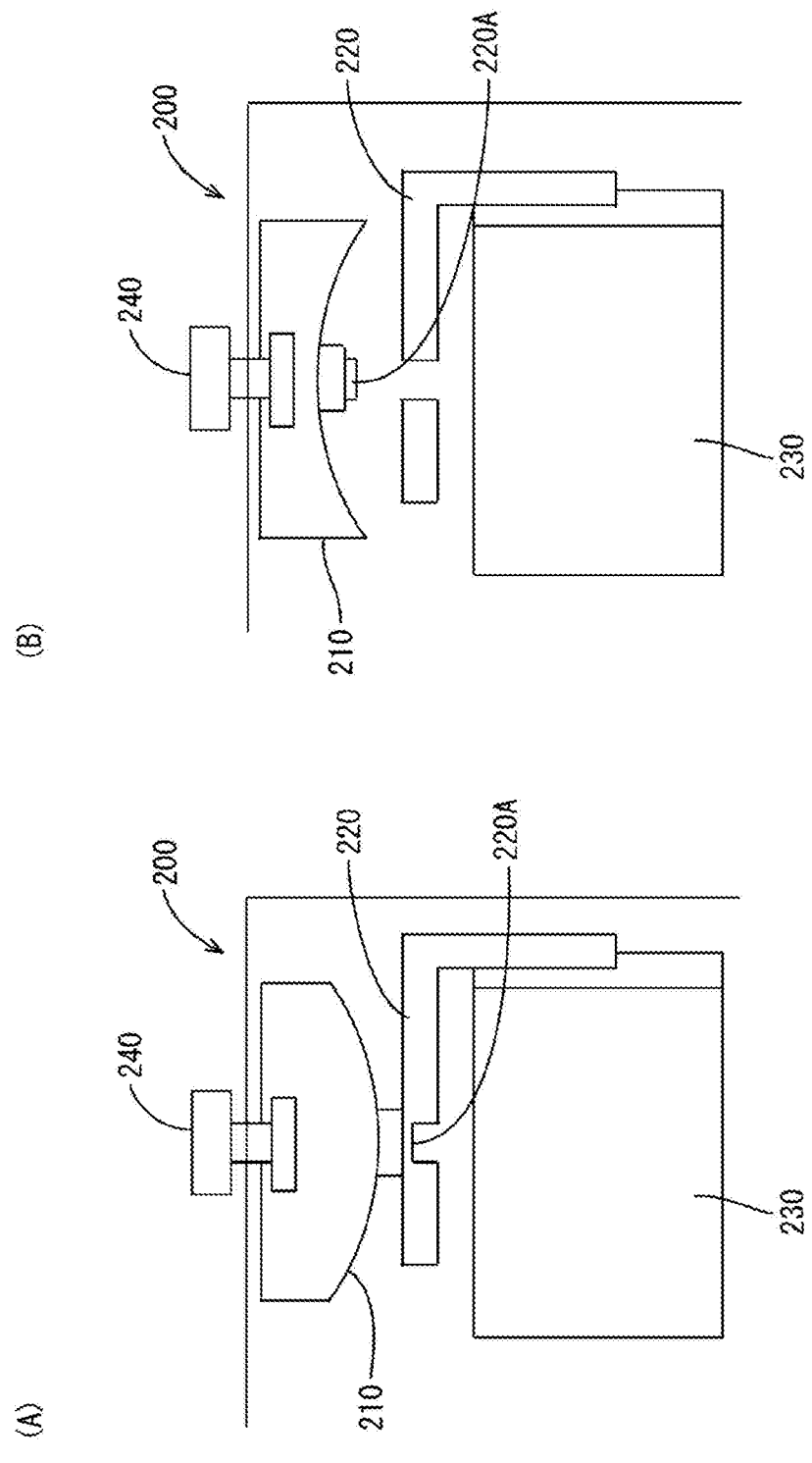
FIG. 18 is a diagram showing another mode of a breaker.

(2) In Embodiment 1 above, the relay having the mechanical contacts is exemplified as an example of the breaker 45. The breaker 45 is not limited to the relay, and may be a semiconductor switch such as a FET, a fuse, a magnet switch, or the like. When the breaker 45 is a fuse, arc discharge or avalanche breakdown does not occur at the time of interruption. Hence, it is preferable to evaluate damage only by the heat generation amount Q1 during the first time T1. The breaker may be a current breaking mechanism provided inside a secondary battery 200. The current breaking mechanism is a metal inverting film 210, for example, and as shown in FIGS. 18(a) and 18(b), is inverted in response to an increase in the internal pressure of the secondary battery 200. Due to the inversion of the inverting film 210, a part 220A of a current collector 220 bonded to the inverting film 210 is broken, and the current is interrupted. In FIG. 18, reference sign 230 represents an electrode assembly, and reference sign 240 represents a terminal.

Figure 19:
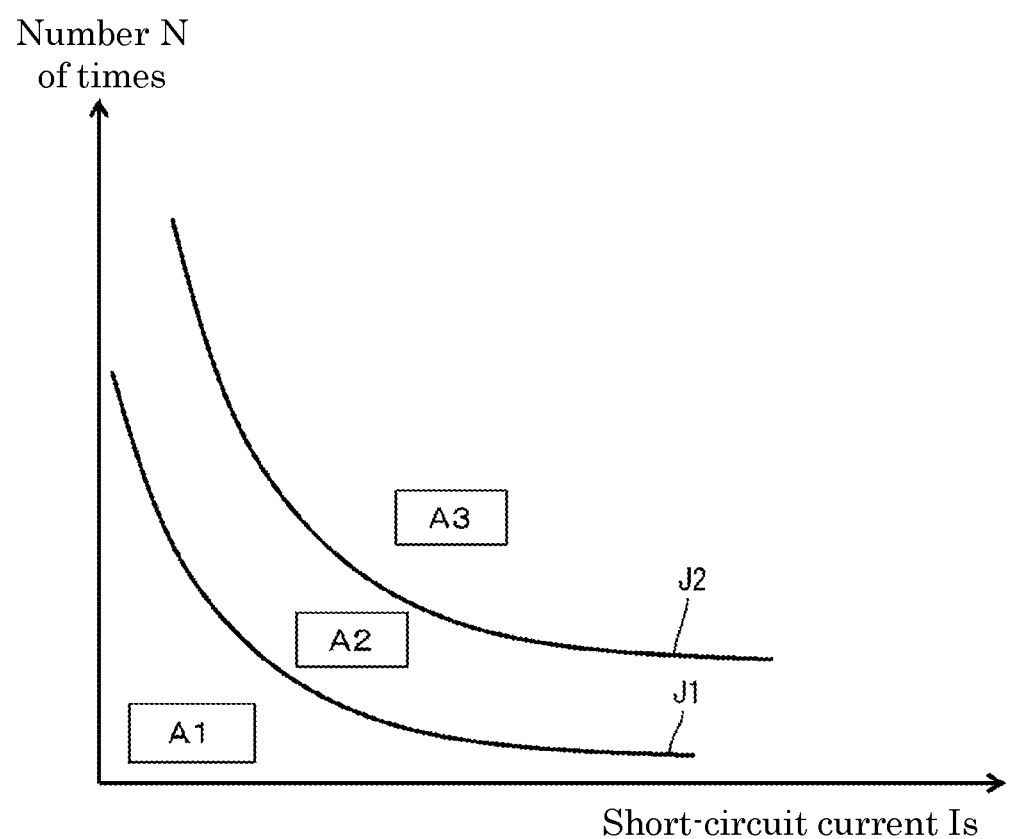
FIG. 19 is a graph showing determination curves J1 and J2.

(3) In Embodiment 1 above, the CPU 52 uses one determination curve J to diagnose damage to the breaker 45 in two stages (small damage, large damage). As shown in FIG. 19, the CPU 52 may use multiple determination curves J1 and J2 to diagnose damage to the breaker 45 in multiple stages (three or more stages). In FIG. 19, an area A1 indicates a small damage, an area A2 indicates an intermediate damage, and an area A3 indicates a large damage.

(4) In Embodiment 1 above, the CPU 52 diagnoses damage to the breaker 45 on the basis of the number N of external short circuits and the magnitude of the short-circuit current Is for each external short circuit. In addition to this, the CPU 52 may calculate the heat generation amount Q of the breaker 45 from the latest short-circuit current Is and its first time Ts without considering the past history, and diagnose damage to the breaker 45 on the basis of the magnitude of the calculated heat generation amount Q. As shown in FIG. 20, the CPU 52 may diagnose damage to the breaker 45 based only on the magnitude of the short-circuit current Is.

(5) Embodiment 1 above shows an example in which the breaker 45, the current sensor 47, and the management device 50 are provided inside the battery BT1. The breaker 45, the current sensor 47, and the management device 50 may be provided outside the battery BT1.

DESCRIPTION OF REFERENCE SIGNS

2: Secondary battery (energy storage device)
40: Assembled battery
45: Breaker
47: Current sensor
50: Management device
51: Processing unit
61: Warning lamp
63: External switch
BT1: Battery (energy storage apparatus)
VH: Vehicle
Ts: First time
Tw: Downtime
T1: First time
T2: Second time

The invention claimed is:
1. An energy storage apparatus comprising:
an energy storage device comprising a lithium ion secondary battery;
a breaker that interrupts a current of the energy storage device;
a management device comprising a processing unit that sends an interruption command and a recovery command to switch the breaker;
a housing that houses the energy storage device; and
an external terminal provided in the housing,
wherein the breaker is provided in a conduction path connecting the energy storage device and the external terminal,
wherein the processing unit determines whether the breaker is reusable on a basis of at least two elements including a magnitude of a short-circuit current flowed through the energy storage device, the breaker, and the external terminal at a time of an external short circuit of the external terminal, a number of external short circuits of the external terminal taken place, a time during which the short-circuit current flowed through the breaker, and wherein the processing unit sends, if the breaker is determined to be reusable, the recovery command to switch the breaker from open to close and to cause the energy storage apparatus to return to a usable state.

2. The energy storage apparatus according to claim 1, wherein the breaker comprises a semiconductor switch.

3. An energy storage apparatus comprising:

an energy storage device comprising a lithium ion secondary battery;

a breaker that interrupts a current of the energy storage device;

a management device comprising a processing unit that sends an interruption command and a recovery command to switch the breaker;

a housing that houses the energy storage device; and an external terminal provided in the housing, wherein the breaker is provided in a conduction path connecting the energy storage device and the external terminal, wherein the processing unit determines whether the breaker is reusable on a basis of a short-circuit current during a first time from a detection to an interruption of a short circuit, and a short-circuit current during a second time from the interruption to convergence of the short-circuit current, and wherein the processing unit sends, if the breaker is determined to be reusable, the recovery command to switch the breaker from open to close and to cause the energy storage apparatus to return to a usable state.

4. The energy storage apparatus according to claim 3, wherein the processing unit determines a damage to the breaker on a basis of a heat generation amount of the breaker during the first time and a heat generation amount of the breaker during the second time.

5. The energy storage apparatus according to claim 3, wherein the breaker comprises a semiconductor switch.

\* \* \* \* \*